US012660313B2

(12) United States Patent
    Kim et al.

(10) Patent No.: US 12,660,313 B2
(45) Date of Patent: Jun. 16, 2026

(54) DISPLAY DEVICE

(71) Applicant: Samsung Display Co., LTD., Yongin-si (KR)

(72) Inventors: Jong In Kim, Seoul (KR); Hyun Seong Kang, Cheonan-si (KR); Joon Geol Kim, Hwaseong-si (KR); Seung Sok Son, Goyang-si (KR); Woo Geun Lee, Suwon-si (KR); Young Jae Jeon, Hwaseong-si (KR); Soo Jung Chae, Seoul (KR); Ji Yun Hong, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 222 days.

(21) Appl. No.: 17/475,950

(22) Filed: Sep. 15, 2021

(65) Prior Publication Data

US 2022/0140059 A1     May 5, 2022

(30) Foreign Application Priority Data

Nov. 3, 2020     (KR) ........................ 10-2020-0145310

(51) Int. Cl.
    H10K 77/10        (2023.01)
    H10D 86/40        (2025.01)
    (Continued)

(52) U.S. Cl.
    CPC ....... H10D 86/441 (2025.01); H10K 59/1315 (2023.02); H10K 77/111 (2023.02); H10K 59/131 (2023.02); H10K 59/8794 (2023.02)

(58) Field of Classification Search
    CPC .... H10K 59/131; H10K 77/111; H10K 50/87; H10K 59/126; H10K 59/1315; H10K 59/124; H10K 59/8794; H01L 27/1255; H01L 27/124; H01L 27/1218; H05K 7/20954; H05K 1/111; H05K 3/321; Y02E 10/549; H10D 86/441; H10D 86/481; H10D 86/60
    See application file for complete search history.

(56) References Cited

U.S. PATENT DOCUMENTS 9,978,828 B2    5/2018  Kim
10,943,970 B2   3/2021  Jo et al.
(Continued)

FOREIGN PATENT DOCUMENTS

CN        106896552 A      6/2017
CN        110034150 A      7/2019
(Continued)

*Primary Examiner* — Meiya Li
(74) *Attorney, Agent, or Firm* — Harness, Dickey & Pierce, P.L.C.

(57)        ABSTRACT

A display device includes a pixel electrode disposed on a first surface of a substrate, a light emitting layer disposed on the pixel electrode, a common electrode disposed on the light emitting layer, a supply voltage line disposed on the first surface of the substrate and applying a voltage to the common electrode, a first auxiliary conductive layer disposed on a second surface of the substrate, and a first connection conductive layer at least partially disposed on a side surface of the substrate and electrically connecting the first auxiliary conductive layer to the supply voltage line.

23 Claims, 15 Drawing Sheets

120: 121, 122, 123, 124
130: 131, 132, 133, 134, 135, 136
140: 141, 142, 143, 144, 145, 146, 147, 148, 149, WPD
150: 151, 152, 153
CST: CST1, CST2, CST3

(51) Int. Cl.
    *H10K 59/131*         (2023.01)
    *H10K 59/80*          (2023.01)

(56)             References Cited

U.S. PATENT DOCUMENTS

| | | | |
|---|---|---|---|
| 2016/0043153 A1* | 2/2016 | Min | H10K 59/131 |
| | | | 257/40 |
| 2016/0190228 A1* | 6/2016 | Park | H10K 59/1315 |
| | | | 257/40 |
| 2017/0123533 A1* | 5/2017 | Jo | G06F 3/041 |
| 2019/0043928 A1* | 2/2019 | Hong | H10K 50/844 |
| 2020/0163216 A1 | 5/2020 | You et al. | |
| 2020/0185638 A1* | 6/2020 | Choi | H10K 50/824 |
| 2021/0066432 A1* | 3/2021 | Lim | H10K 50/844 |
| 2022/0108635 A1* | 4/2022 | Park | G09F 9/301 |

FOREIGN PATENT DOCUMENTS

| | | |
|---|---|---|
| KR | 10-2006-0093755 | 8/2006 |
| KR | 10-2010-0042799 | 4/2010 |
| KR | 10-2013-0046301 | 5/2013 |
| KR | 10-2015-0127968 | 11/2015 |
| KR | 10-2017-0051614 | 5/2017 |
| KR | 20170071245 A | 6/2017 |
| KR | 20180036434 A | 4/2018 |
| KR | 20190036962 A | 4/2019 |
| KR | 10-2020-0040965 | 4/2020 |

\* cited by examiner

Figure 2:
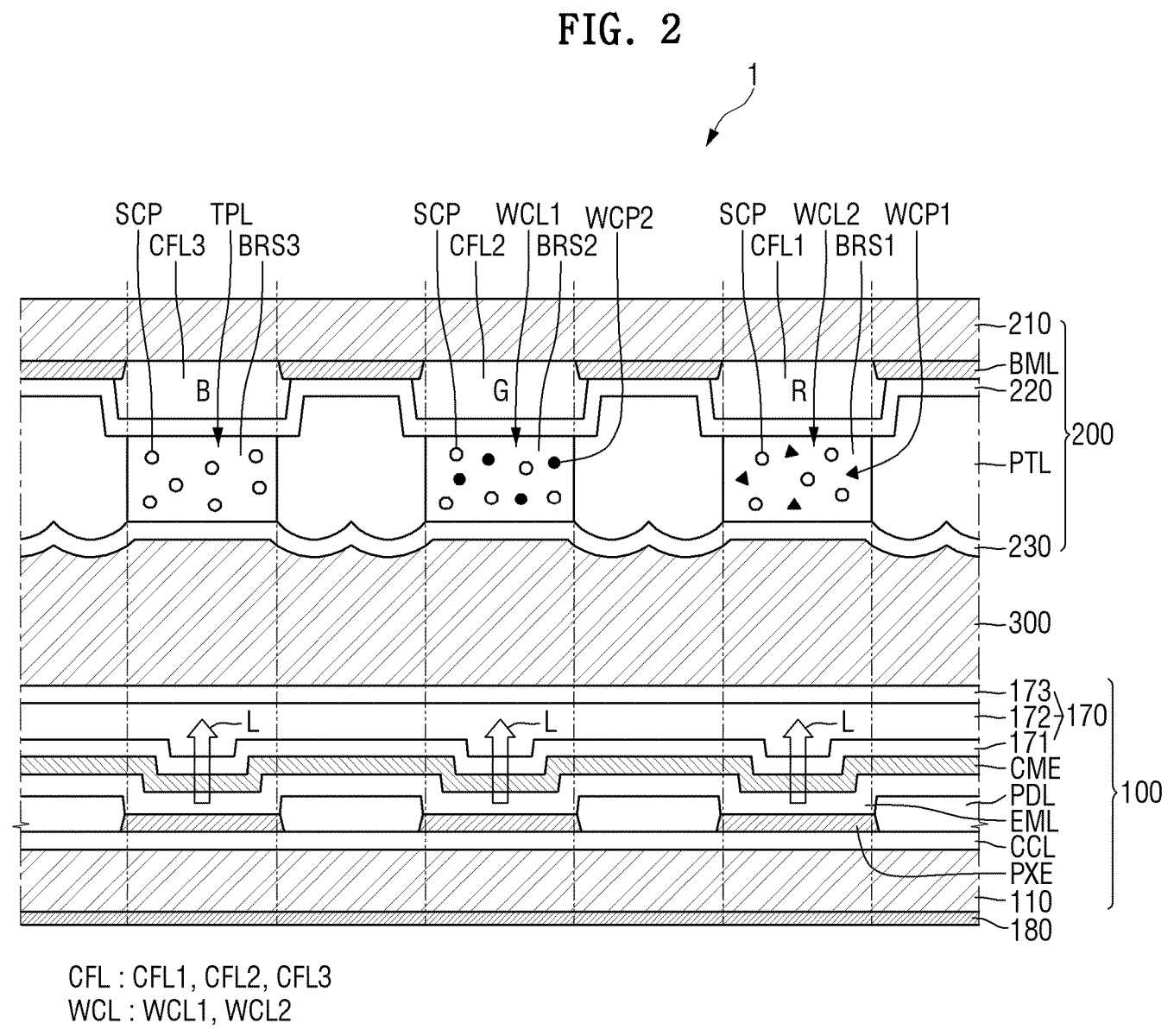

210
BML
220
PTL
200
230
300
173
172 170
171
CME
PDL
EML
CCL
PXE
110
180
100

SCP WCL2 WCP1
CFL1 BRS1
R

SCP WCL1 WCP2
CFL2 BRS2
G

SCP TPL BRS3
CFL3
B

L

CFL : CFL1, CFL2, CFL3
WCL : WCL1, WCL2

120: 121, 122, 123, 124
130: 131, 132, 133, 134, 135, 136
140: 141, 142, 143, 144, 145, 146, 147, 148, 149
150: 151, 152, 153
CST: CST1, CST2, CST3

XII

XI

XII'

XI'

600

400

CTL_3

Figure 11:
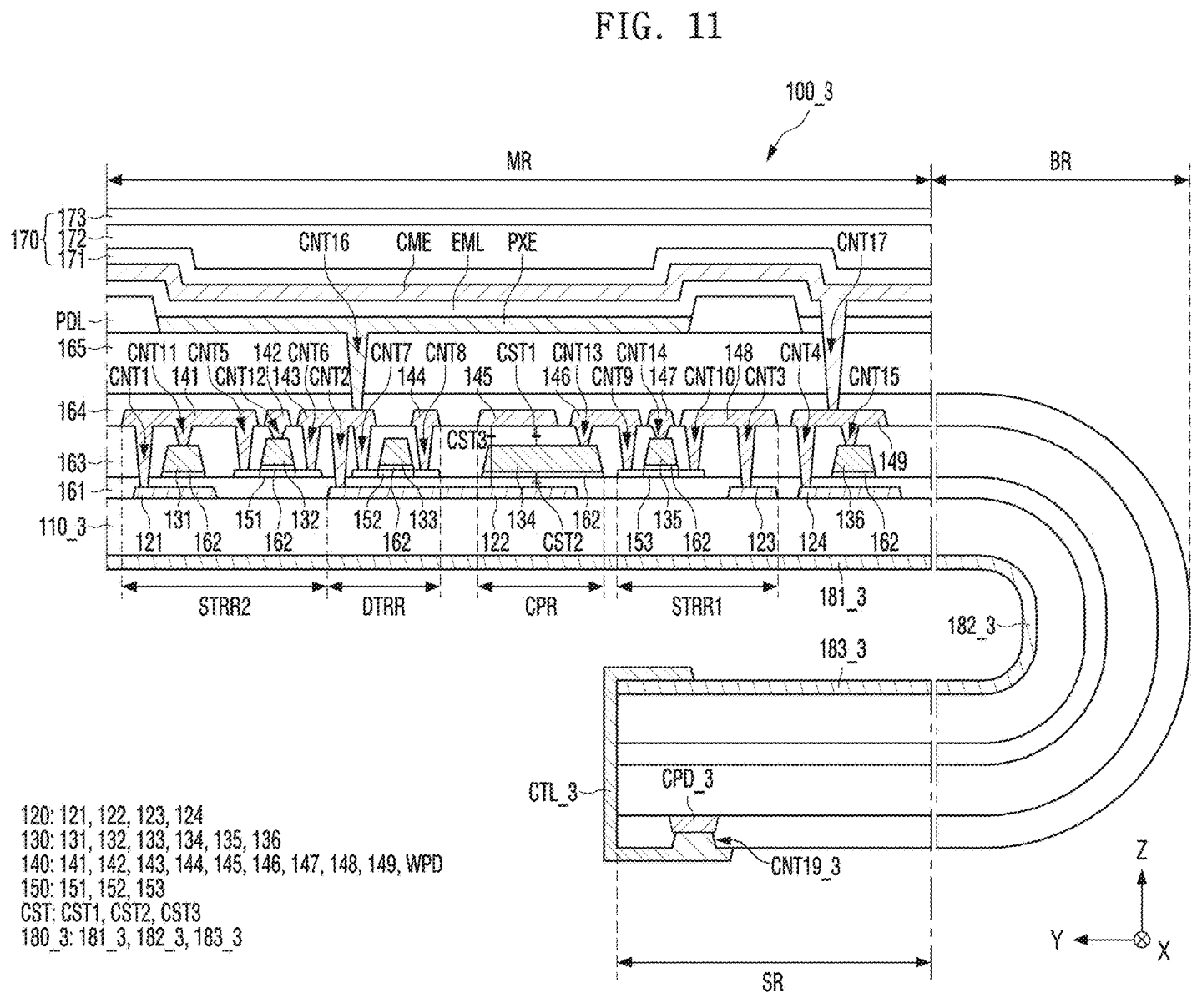

120: 121, 122, 123, 124
130: 131, 132, 133, 134, 135, 136
140: 141, 142, 143, 144, 145, 146, 147, 148, 149, WPD
150: 151, 152, 153
CST: CST1, CST2, CST3
180_3: 181_3, 182_3, 183_3

FIG. 12

120: 121, 122, 123, 124
130: 131, 132, 133, 134, 135, 136
140: 141, 142, 143, 144, 145, 146, 147, 148, 149, WPD
150: 151, 152, 153
CST: CST1, CST2, CST3

FIG. 15

DISPLAY DEVICE

CROSS-REFERENCE TO RELATED APPLICATIONS

This application claims priority to and benefits of Korean Patent Application No. 10-2020-0145310 under 35 U.S.C. § 119, filed on Nov. 3, 2020 in the Korean Intellectual Property Office, the entire contents of which are incorporated herein by reference.

BACKGROUND

1. Technical Field

The disclosure relates to a display device.

2. Description of the Related Art

Display devices have become increasingly important as multimedia technology evolves. Accordingly, a wide variety of types of display devices such as organic light-emitting display (OLED) devices and liquid-crystal display (LCD) devices are currently used. Such display devices find a variety of applications including mobile electronic devices, e.g., portable electronic devices such as smart phones, smart watches, and tablet PCs.

Recently, display devices capable of displaying images in high resolution have been released. Such a high-resolution display devices include a larger number of pixels, and thus the driving voltage may not be uniformly applied to the pixels, and a low voltage may be applied to some of the pixels.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that can mitigate voltage drop of a supply voltage applied to a common electrode by using an auxiliary conductive layer disposed on the rear surface of the substrate and electrically connected to the common electrode.

It should be noted that objects of the disclosure are not limited to the above-mentioned object; and other objects of the disclosure will be apparent to those skilled in the art from the following descriptions.

An embodiment of a display device may include a pixel electrode disposed on a first surface of a substrate, a light emitting layer disposed on the pixel electrode, a common electrode disposed on the light emitting layer, a supply voltage line disposed on the first surface of the substrate and applying a voltage to the common electrode, a first auxiliary conductive layer disposed on a second surface of the substrate, and a first connection conductive layer at least partially disposed on a side surface of the substrate and electrically connecting the first auxiliary conductive layer to the supply voltage line.

An embodiment of the display device may include first circuit boards attached an end of the substrate, second circuit boards attached to the first circuit boards, and a second connection conductive layer disposed between the second circuit boards and the first auxiliary conductive layer.

In an embodiment, the first circuit boards may be arranged in a direction along the substrate, and the first connection conductive layer may be disposed between the first circuit boards.

In an embodiment, the first connection conductive layer may contact the side surface of the substrate.

In an embodiment, the first connection conductive layer may comprise a metal paste or a conductive tape.

In an embodiment, the first connection conductive layer may electrically contact the supply voltage line.

In an embodiment, the display device may include an insulating layer disposed between the substrate and the pixel electrode, and a second auxiliary conductive layer that electrically contacts the common electrode through a contact hole penetrating the light emitting layer and the insulating layer.

In an embodiment, the substrate may be a flexible substrate.

In an embodiment, the substrate may include a main region, a bending region extended from the main region, and a subsidiary region extended from the bending region and may extend parallel to the main region. The first auxiliary conductive layer may be disposed on the second surface of the substrate in the main region.

In an embodiment, the first auxiliary conductive layer may be entirely disposed on the second surface of the substrate.

In an embodiment, the substrate may include a display area and a non-display area adjacent to the display area. The first auxiliary conductive layer may be disposed on the second surface of the substrate in the non-display area.

An embodiment of a display device may include an insulating layer disposed on a first surface of a substrate, a supply voltage line disposed on the insulating layer, a pixel electrode disposed on the insulating layer, a light emitting layer disposed on the pixel electrode, a common electrode disposed on the light emitting layer and receiving a voltage from the supply voltage line, and an auxiliary conductive layer disposed on a second surface of the substrate. The supply voltage line may be electrically connected to the auxiliary conductive layer through a contact hole penetrating the insulating layer.

In an embodiment, the auxiliary conductive layer may be entirely disposed on the second surface of the substrate.

In an embodiment, the substrate may include a display area and a non-display area adjacent to the display area. The contact hole may be disposed in the non-display area.

In an embodiment, the substrate may include a display area and a non-display area adjacent to the display area. The auxiliary conductive layer may be disposed on the second surface of the substrate in the non-display area.

In an embodiment, the substrate may be a flexible substrate.

In an embodiment, the substrate may include a main region, a bending region extended from the main region, and a subsidiary region extended from the bending region and parallel to the main region. The auxiliary conductive layer may be disposed on the second surface of the substrate in the main region.

In an embodiment, the display device may include a first connection conductive layer at least partially disposed on a side surface of the substrate and electrically connecting the auxiliary conductive layer to the supply voltage line.

In an embodiment, the display device may include first circuit boards attached to an end of the substrate, second circuit boards attached to the first circuit boards, and a second connection conductive layer disposed between the second circuit boards and the auxiliary conductive layer.

In an embodiment, the first circuit boards may be arranged in a direction along the substrate, and the first connection conductive layer may be disposed between the first circuit boards.

According to an embodiment of the disclosure, it is possible to mitigate voltage drop of a supply voltage applied to a common electrode by using an auxiliary conductive layer disposed on the rear surface of a substrate and electrically connected to the common electrode. According to an embodiment of the disclosure, the auxiliary conductive layer of the display device blocks electromagnetic waves or light applied from the outside and prevents accumulation of electric charges, thereby preventing static electricity from being generated in the display device. The auxiliary conductive layer can have heat dissipation properties, so that it is possible to prevent the display device from being overheated. In this manner, the reliability of the display device can be improved.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

FIG. 2 is a schematic cross-sectional view of a display device according to an embodiment of the disclosure.

FIG. 4 is a schematic exploded, perspective view of a display device according to an embodiment of the disclosure.

FIG. 6 is a schematic cross-sectional view of the first display substrate, taken along line VII-VII' of FIG. 4.

FIG. 9 is a schematic exploded perspective view of a display device according to another embodiment of the disclosure.

FIG. 11 is a schematic cross-sectional view of the first display substrate, taken along line XII-XII' of FIG. 9.

FIG. 12 is a schematic cross-sectional view of the first display substrate of the display device of FIG. 9 according to another embodiment.

FIG. 15 is a schematic cross-sectional view, taken along line XVI-XVI' of FIG. 14.

DETAILED DESCRIPTION OF THE EMBODIMENTS

Figure 1:
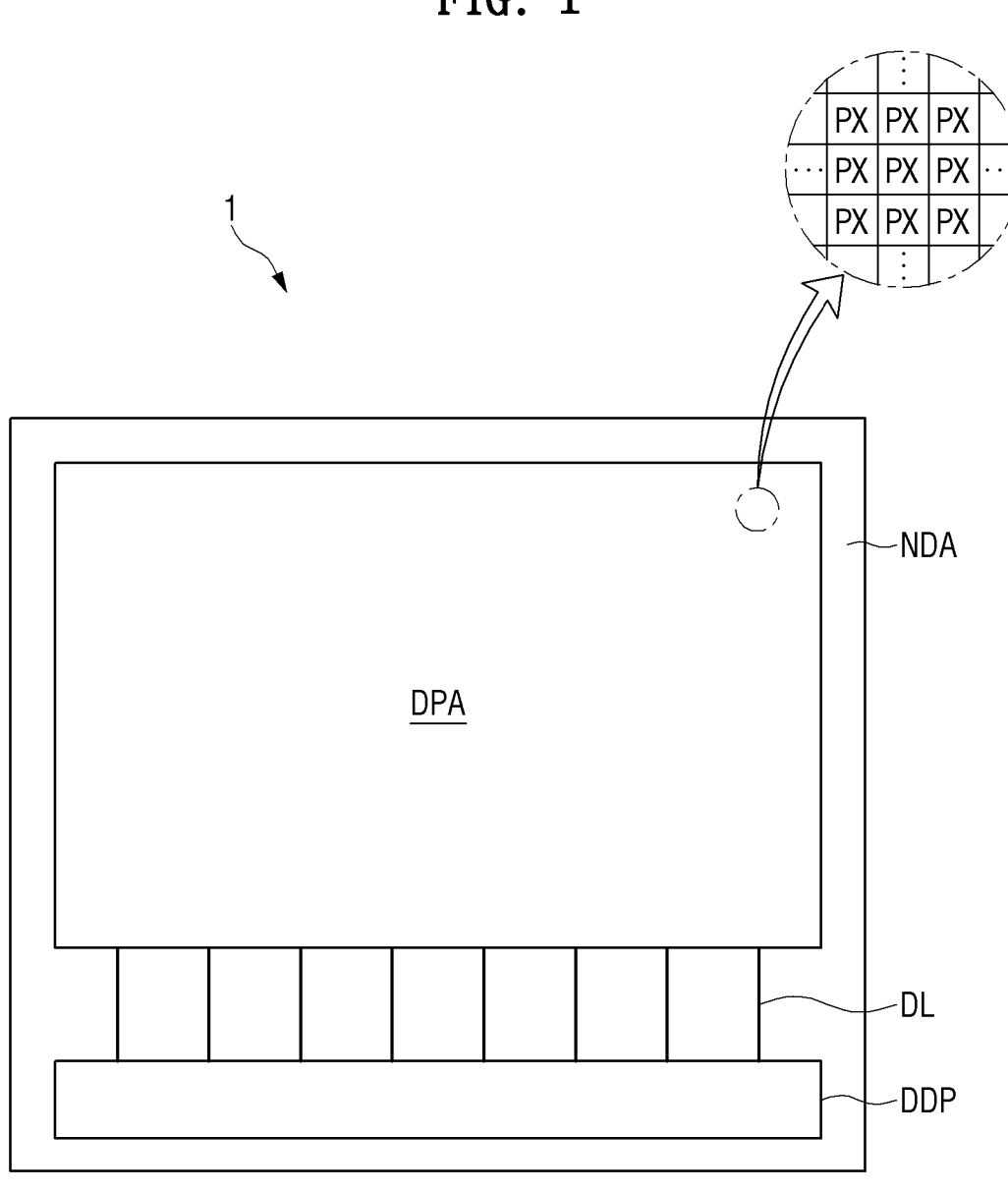
FIG. 1 is a schematic plan view of a display device according to an embodiment of the disclosure.

The will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to the accompanying drawings.

FIG. 1 is a plan view of a display device according to an embodiment of the disclosure.

A display device 1 may refer to any electronic device that provides a display screen. The display device 1 may include devices for providing a display screen, such as a television set, a laptop computer, a monitor, an electronic billboard, a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console, a digital camera, and the Internet of Things devices.

The display device 1 shown in FIG. 1 is for a television set. The display device 1 may have, but is not limited to, a high resolution or ultra-high resolution such as HD, UHD, 4K and 8K.

The display device 1 may be variously classified by the way in which images are displayed. Examples of the classification of display device 1 may include an organic light-emitting display device (OLED), an inorganic light-emitting display device (inorganic EL), a quantum-dot light-emitting display device (QED), a micro LED display device (micro-LED), a nano LED display device (nano-LED), a plasma display device (PDP), a field emission display device (FED), a cathode ray display device (CRT), a liquid-crystal display device (LCD), an electrophoretic display device (EPD), etc. In the following description, an organic light-emitting display device will be described as an example of the display device 1, and the organic light-emitting display device will be simply referred to as the display device 1 unless it is necessary to distinguish them. It is, however, to be understood that the embodiments of the disclosure are not limited to the organic light-emitting display device, and any other display device may be employed without departing from the scope of the disclosure.

The display device 1 may include the display area DPA and a non-display area NDA. The display area DPA may be an active area where images are displayed. The display area DPA may have a rectangular shape similar to the shape of the display device 1 when viewed from the top.

The display area DPA may include pixels PX. The pixels PX may be arranged in a matrix. The shape of each of the pixels PX may be, but is not limited to, a rectangle or a square when viewed from the top. Each of the pixels PX may have a diamond shape having sides inclined with respect to a side of the display device 1. The pixels PX may include different color pixels PX. For example, the pixels PX may include, but is not limited to, a red first color pixel PX, a green second color pixel PX, and a blue third color pixel PX. The stripe-type pixels and PenTile®-type pixels may be arranged alternately.

The non-display areas NDA may be disposed around the display area DPA. The non-display areas NDA may surround the display area DPA entirely or partially. The display area DPA may have a rectangular shape, and the non-display areas NDA may be disposed to be adjacent to the four sides of the display area DPA. The non-display areas NDA may form the bezel of the display device 1.

In the non-display areas NDA, a driver DDP for driving the display area DPA may be disposed. For example, the driver DDP may be a driver circuit or a driver element. The driver DDP may be connected to each of the pixels PX in the display area DPA through driving lines DL.

FIG. 2 is a schematic cross-sectional view of a display device according to an embodiment of the disclosure.

Although a top-emission display device is shown in the example shown in FIG. 2, in which light L exits toward the side where a second base substrate 210 is disposed, instead of a first base substrate 110 where a light emitting layer EML is formed, the disclosure is not limited thereto. The display device 1 may be a bottom-emission or a double-sided display device.

Referring to FIG. 2, the display device 1 may include a first display substrate 100, a second display substrate 200 opposed to the first display substrate 100, and a filler layer 300 coupling them.

The first display substrate 100 may include the first base substrate 110, the light emitting layer EML disposed on a surface of the first base substrate 110, and an encapsulation structure 170 disposed on the light emitting layer EML.

The first base substrate 110 of the first display substrate 100 may be an insulating substrate. The first base substrate 110 may be a rigid substrate such as glass.

Pixel electrodes PXE may be disposed on the surface of the first base substrate 110. The pixel electrodes PXE may be disposed in the pixels PX, respectively. A circuit layer CCL driving the pixels PX may be disposed on the first base substrate 110. The circuit layer CCL may be disposed between the first base substrate 110 and the pixel electrodes PXE. The circuit layer CCL will be described in detail later.

Each of the pixel electrodes PXE may be a first electrode, e.g., an anode electrode of a light-emitting diode. The pixel electrode PXE may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof. A material layer having a higher work function may be disposed on a higher layer than a reflective material layer so that it may be closer to the light emitting layer EML. The pixel electrodes PXE may have, but is not limited to, a multilayer structure of ITO/Mg, ITO/MgF, ITO/Ag, and ITO/Ag/ITO.

A pixel-defining layer PDL may be disposed on the surface of the first base substrate 110 along the boundary of the pixel PX. The pixel-defining layer PDL may be disposed over the pixel electrode PXE, and may include an opening exposing the pixel electrode PXE.

The light emitting layer EML may be disposed on the pixel electrode PXE exposed by the pixel-defining layer PDL. The light emitting layer EML may include an organic, emissive layer and may further include hole injection/transport layers and/or electron injection/transport layers as auxiliary layers in some implementations to facilitate emission. In another embodiment where the display device 1 is a micro LED display device, a nano LED display device, or a similar display device, the light emitting layer EML may include an inorganic material such as an inorganic semiconductor.

According to an embodiment of the disclosure, the light emitting layers EML of the different color pixels PX may emit light of the same wavelength. For example, the light emitting layer EML of each color pixel PX may emit blue light or ultraviolet light, and the second display substrate 200 may include a wavelength conversion layer WCL, so that different pixels PX can display lights of different colors.

According to another embodiment of the disclosure, the light emitting layers EML of different color pixels PX may emit lights of different wavelengths. For example, the light emitting layer EML of a first color pixel PX may emit light of a first color, the light emitting layer EML of a second color pixel PX may emit light of a second color, and the light emitting layer EML of a third color pixel PX may emit light of a third color.

A common electrode CME may be disposed on the light emitting layer EML. The common electrode CME may be extended across the pixels PX. The common electrode CME may be disposed on the entire surface across the pixels PX. The common electrode CME may be a second electrode of the light-emitting diode, i.e., a cathode electrode.

The common electrode CME may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The common electrode CME may further include a transparent metal oxide layer disposed on the material layer having a small work function.

The pixel electrode PXE, the light emitting layer EML and the common electrode CME may form a light-emitting element (e.g., an organic light-emitting element). Light emitted from the light emitting layer EML may pass through the common electrode 25 to exit upwardly.

The thin-film encapsulation structure 170 may be disposed on the common electrode CME. The thin-film encapsulation structure 170 may include at least one thin-film encapsulation layer. For example, the thin-film encapsulation layer may include a first inorganic film 171, an organic film 172, and a second inorganic film 173.

An auxiliary conductive layer 180 may be disposed on the opposite surface of the first base substrate 110. The auxiliary conductive layer 180 may be electrically connected to the common electrode CME. The auxiliary conductive layer 180 may be disposed entirely on the opposite surface of the first base substrate 110 across the pixels PX, but the disclosure is not limited thereto. The auxiliary conductive layer 180 may be partially disposed on the opposite surface of the first base substrate 110.

The auxiliary conductive layer 180 may include a material having conductivity and heat dissipation properties. The auxiliary conductive layer 180 may include a metal or a transparent conductive material. For example, when the display device 1 is a top-emission display device, the auxiliary conductive layer 180 may include at least one of Al, Cu, Ti and Mo, which are opaque metals. When the display device 1 is a bottom-emission or double-sided display device, the auxiliary conductive layer 180 may include the above-described opaque metal in the form of a thin film, or at least one of ITO and IZO, which are transparent conductive materials.

The second display substrate 200 may be disposed above the thin-film encapsulation structure 170 and face the thin-film encapsulation structure 170.

The second base substrate 210 of the second display substrate 200 may include a transparent insulating material such as glass. The second base substrate 210 may be a rigid substrate.

A light-blocking member BML may be disposed along the boundary of the pixel PX on a surface of the second base substrate 210 which faces the first base substrate 110. The light-blocking member BML may overlap the pixel-defining layer PDL of the first display substrate 100. The light-blocking member BML may be formed in a lattice pattern when viewed from the top and may include an opening exposing the surface of the second base substrate 210.

A color filter layer CFL may be disposed on the surface of the second base substrate 210 on which the light-blocking member BML is disposed. The color filter layer CFL may be disposed on the surface of the second base substrate 210 exposed through the opening of the light-blocking member BML.

The color filter layer CFL may include a first color filter layer CFL1 disposed in the first color pixel PX, a second color filter layer CFL2 disposed in the second color pixel PX, and a third color filter layer CFL3 disposed in the third color pixel PX. Each color filter layer CFL may include a colorant such as a dye and a pigment which absorb wavelengths other than the wavelength of the color it represents. The first color filter layer CFL1 may be a red color filter layer, the second color filter layer CFL2 may be a green color filter layer, and the third color filter layer CFL3 may be a blue color filter layer.

A first capping layer 220 for preventing permeation of impurities such as moisture and air may be disposed on the color filter layer CFL.

A partition wall PTL may be disposed on the first capping layer 220. The partition wall PTL may be disposed so that it overlaps the light-blocking member BML. The partition wall PTL may include an opening via which the color filter layer CFL is exposed.

A wavelength conversion layer WCL or a transparent layer TPL may be disposed in the space exposed by the opening of the partition wall PTL. The wavelength conversion layer WCL and the transparent layer TPL may be formed by, but is not limited to, an inkjet process using the partition wall PTL as a bank.

The wavelength conversion layer WCL may include a first wavelength conversion pattern WCL1 disposed in the first color pixel PX, and a second wavelength conversion pattern WCL2 disposed in the second color pixel PX. The first wavelength conversion pattern WCL1 converts light of the third color incident from the light emitting layer EML into light of the first color. The second wavelength conversion pattern WCL2 converts light of the third color incident from the light emitting layer EML into light of the second color.

The wavelength conversion patterns WCL1 and WCL2 may include base resins BRS1 and BRS2 and wavelength conversion materials WCP1 and WCP2 dispersed in the base resins BRS1 and BRS2, respectively. The base resins BRS1 and BRS2 may include a transparent organic material. The wavelength conversion materials WCP1 and WCP2 may be quantum dots, quantum rods, phosphors, etc. The quantum dots may include IV nanocrystals, II-VI compound nanocrystals, III-V compound nanocrystals, IV-VI nanocrystals, or combinations thereof.

The transparent layer TPL may be disposed in the third color pixel PX. The transparent layer TPL may include a base resin BRS3 and scatterers SCP dispersed therein. The transparent layer TPL may include no wavelength conversion material.

A second capping layer 230 may be disposed on the wavelength conversion layers WCL and the transparent layer TPL.

The filler layer 300 may be interposed between the first display substrate 100 and the second display substrate 200. The space between the first display substrate 100 and the second display substrate 200 may be filled with the filler layer 300, and they may be coupled with each other by the filler layer 300. The filler layer 300 may be disposed between the thin-film encapsulation structure 170 of the first display substrate 100 and the second capping layer 230 of the second display substrate 200. The filler layer 300 may be made of, but is not limited to, a Si-based organic material, an epoxy-based organic material, etc.

Each of the pixels PX on the first base substrate 110 includes a pixel driving circuit. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. In the following description, the pixel driving circuit having a 3T1C structure including three transistors and one capacitor will be described as an example. It is, however, to be understood that the disclosure is not limited thereto. The pixel structures may be modified to employ other structures such as a 2T1C structure, a 7T1C structure and a 6T1C structure.

Figure 3:
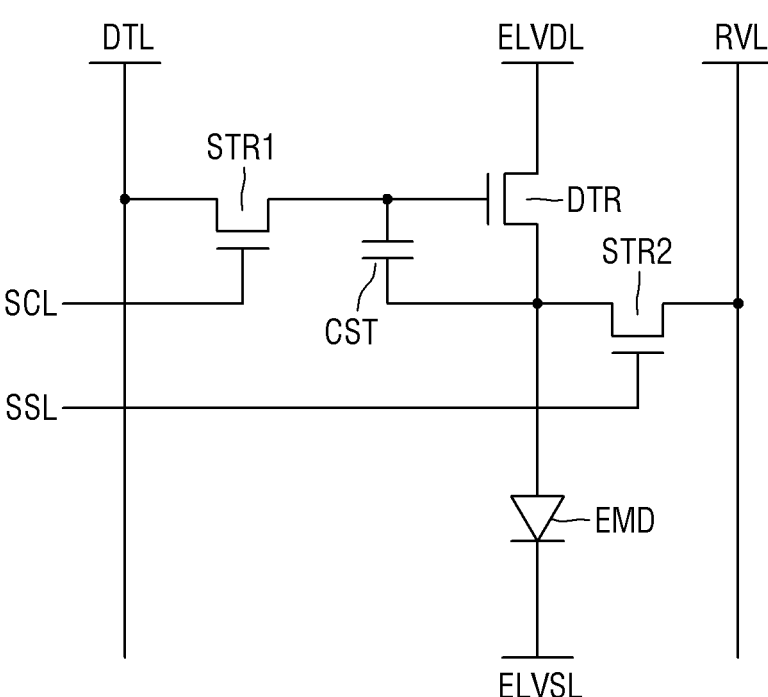
FIG. 3 is an equivalent circuit diagram of a pixel of a display device according to an embodiment of the disclosure.

FIG. 3 is an equivalent circuit diagram of a pixel of a display device according to an embodiment of the disclosure.

Referring to FIG. 3, each of the pixels PX of the display device according to the embodiment may include three transistors DTR, STR1 and STR2 and one storage capacitor CST in addition to a light-emitting diode EMD.

The light-emitting diode EMD may emit light in proportional to the current supplied through the driving transistor DTR. The light-emitting diode EMD may be implemented as an organic light-emitting diode, a micro light-emitting diode, a nano light-emitting diode, etc.

The first electrode (i.e., the anode electrode) of the light-emitting diode EMD may be electrically connected to the source electrode of the driving transistor DTR, and the second electrode (i.e., the cathode electrode) thereof may be electrically connected to a second supply voltage line ELVSL, from which a low-level voltage (second supply voltage) is applied, lower than a high-level voltage (first supply voltage) of a first supply voltage line ELVDL.

The driving transistor DTR may adjust a current flowing from the first supply voltage line ELVDL from which the first supply voltage is applied to the light-emitting diode EMD according to the voltage difference between the gate electrode and the source electrode. The gate electrode of the driving transistor DTR may be electrically connected to a source/drain electrode of the first switching transistor STR1, the source electrode may be electrically connected to a first electrode of the light-emitting diode EMD, and the drain electrode may be electrically connected to the first supply voltage line ELVDL from which the first supply voltage is applied.

The first switching transistor STR1 may be turned on by a scan signal of a scan line SCL to electrically connect a data line DTL with the gate electrode of the driving transistor DTR. A gate electrode of the first switching transistor STR1 may be electrically connected to the scan line SCL, the first source/drain electrode may be electrically connected to the gate electrode of the driving transistor DTR1, and a second source/drain electrode thereof may be electrically connected to the data line DTL.

The second switching transistor STR2 may be turned on by a sensing signal of a sensing signal line SSL to electrically connect a reference voltage line RVL to the source electrode of the driving transistor DTR. A gate electrode of the second switching transistor ST2 may be electrically connected to the sensing signal line SSL, the first source/drain electrode thereof may be electrically connected to the reference voltage line RVL, and the second source/drain electrode thereof may be electrically connected to the source electrode of the driving transistor DTR.

According to an embodiment of the disclosure, the first source/drain electrode of each of the first and second switching transistors STR1 and STR2 may be a source electrode while the second source/drain electrode thereof may be a drain electrode. It is, however, to be understood that the disclosure is not limited thereto. The first source/drain electrode of each of the first and second switching transistors STR1 and STR2 may be a drain electrode while the second source/drain electrode thereof may be a source electrode.

The storage capacitor CST may be formed between the gate electrode and the source electrode of the driving transistor DTR. The storage capacitor CST stores a voltage difference between the gate voltage and the source voltage of the driving transistor DTR.

The driving transistor DTR and the first and second switching transistors STR1 and STR2 may be formed as thin-film transistors. Although FIG. 3 shows that each of the driving transistor DTR and the first and second switching transistors STR1 and STR2 is implemented as an n-type MOSFET (metal oxide semiconductor field effect transistor), the disclosure is not limited thereto. The driving transistor DTR and the first and second switching transistors STR1 and STR2 may be implemented as p-type MOSFETs, or some of the transistors may be implemented as n-type MOSFETs while the others may be implemented as p-type MOSFETs.

Hereinafter, the stack structure of the first display substrate 100 will be described in detail.

Figure 4:
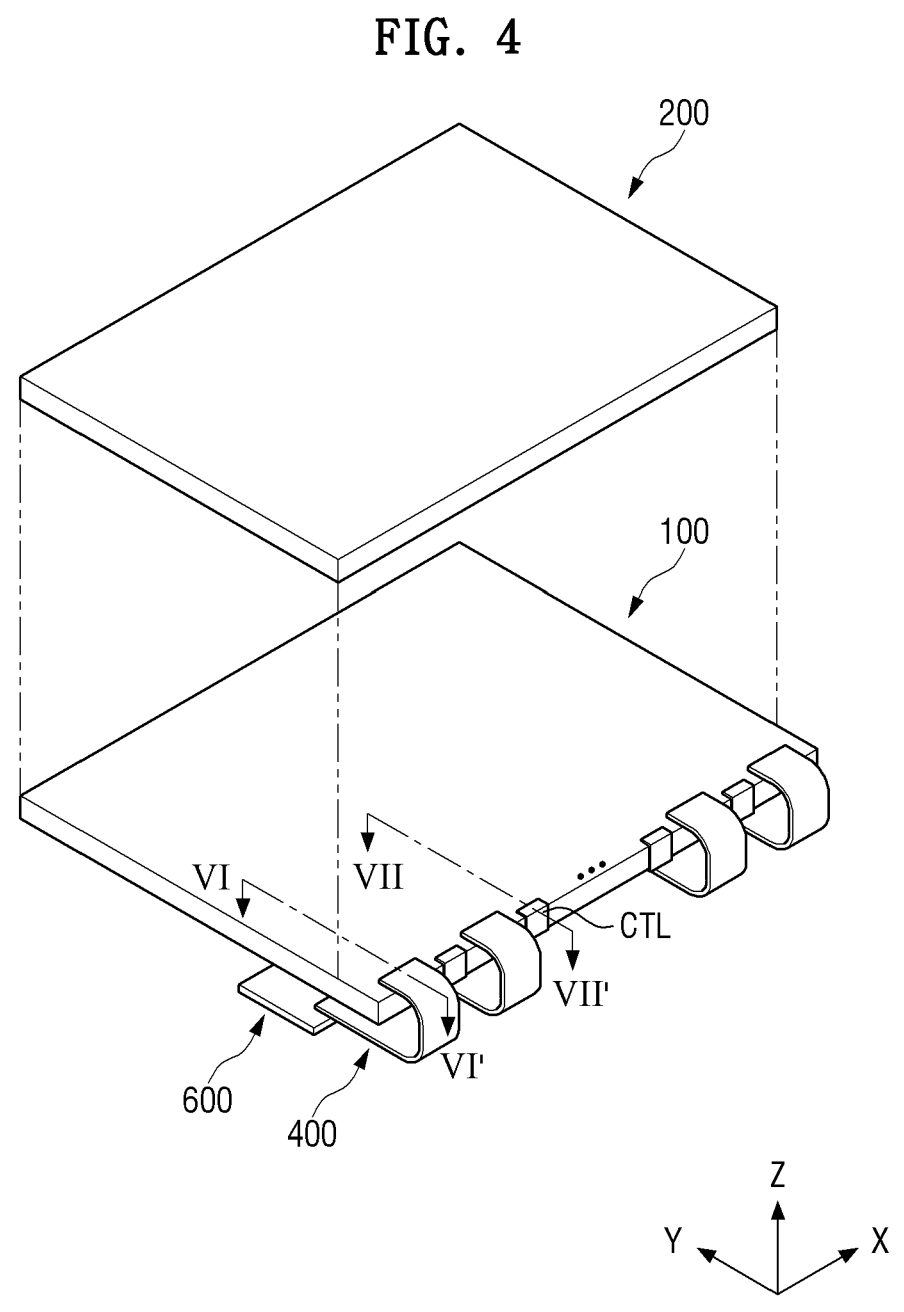
Figure 5:
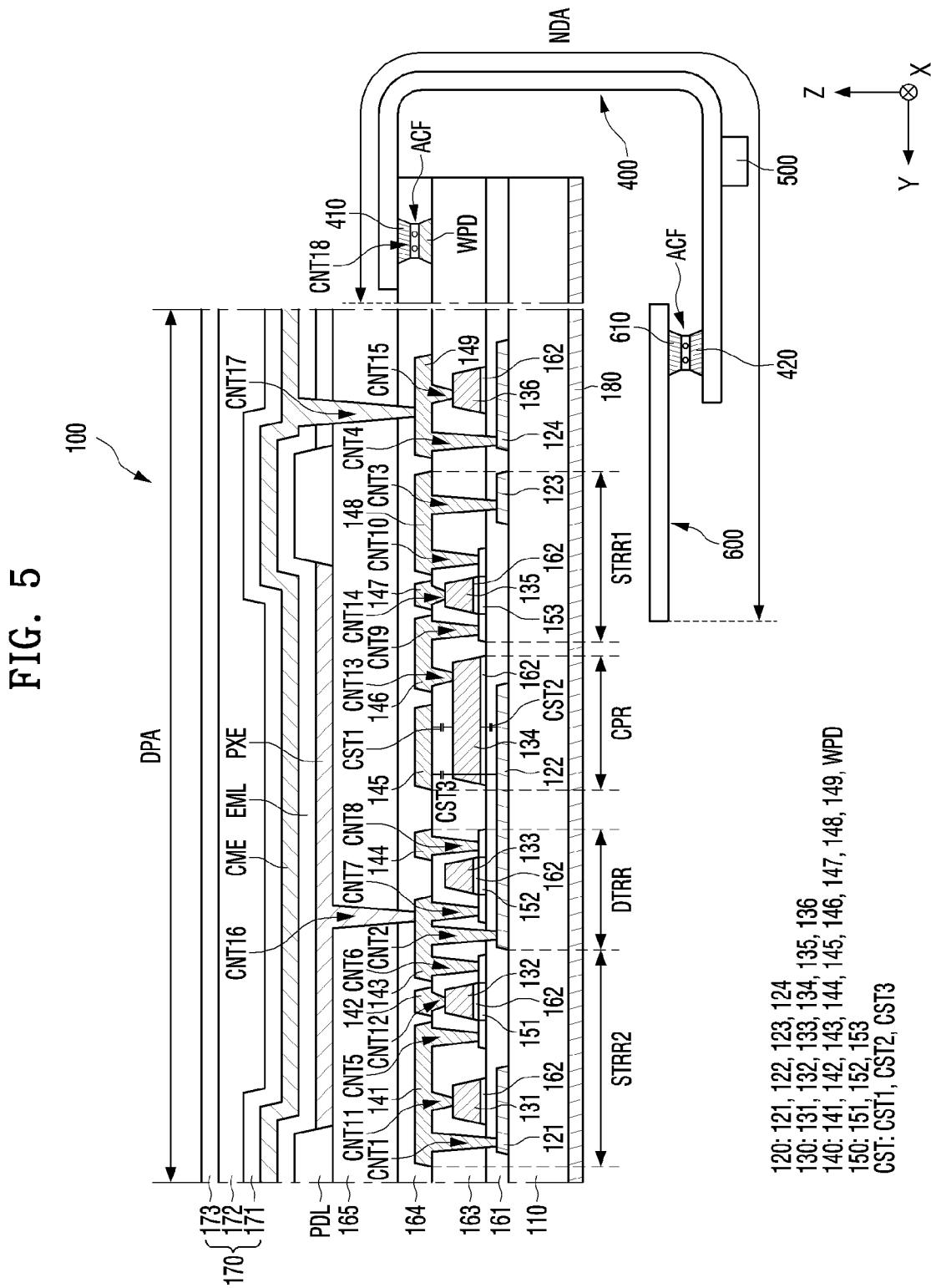
FIG. 5 is a schematic cross-sectional view of the first display substrate, taken along line VI-VI' of FIG. 4.
Figure 6:
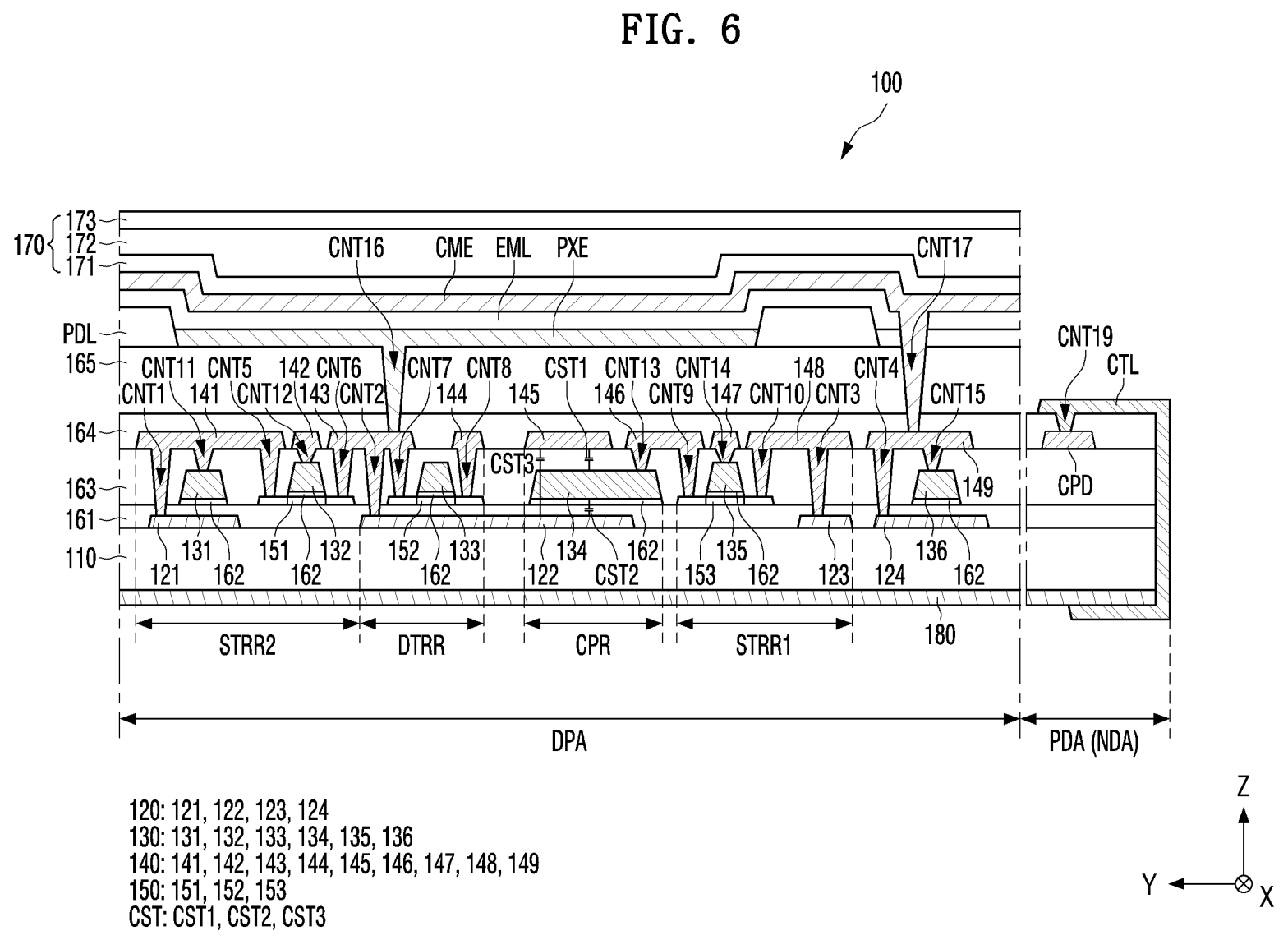

FIG. 4 is an exploded, perspective view of a display device according to an embodiment of the disclosure. FIG. 5 is a cross-sectional view of the first display substrate, taken along line VI-VI' of FIG. 4. FIG. 6 is a cross-sectional view of the first display substrate, taken along line VII-VII' of FIG. 4.

FIGS. 5 and 6 show the stack structure of the first display substrate 100, focusing on the circuit layer CCL. In FIGS. 5 and 6, a cross-section of a part of the display area DPA and a part of the non-display area NDA are shown together. The cross-section of the display area DPA illustrate a driving transistor region DTRR in which the driving transistor DTR of a pixel is disposed, a first switching transistor region STR1 in which the first switching transistor STR1 is disposed, a second switching transistor region STRR2 in which the second switching transistor STR2 is disposed, and a capacitor region CPR. The cross-section of the non-display area NDA depicts the pad area PDA.

Referring to FIGS. 4 to 6, the display device 1 according to an embodiment may further include first circuit boards 400 attached to an end of the first display substrate 100, and a second circuit boards 600 attached to second ends of the first circuit boards 400. Driving chips 500 may be mounted on the first circuit boards 400.

The first circuit boards 400 may be arranged such that they are spaced apart from each other along a first directional axis X. Connection conductive layers CTL may be disposed between the first circuit boards 400, which will be described later. A first end of each of the first circuit boards 400 may be attached to the first display substrate 100, while the second end of each of the first circuit boards 400 may be attached to second circuit boards 600.

The first circuit boards 400 may be bent with a curvature in the opposite direction of the third directional axis Z. As the first circuit boards 400 are bent, their faces may be inverted. The part of the surface of the first circuit board 400 that overlaps with the first display substrate 100 may face the third directional axis Z, while the part of the surface of each first circuit board 400 that overlaps the second circuit board 600 may face the opposite direction of the third directional axis Z.

The second circuit boards 600 may each be attached to the second end of a first circuit board 400. The second circuit board 600 may overlap the first display substrate 100. There may be multiple second circuit boards 600. First circuit boards 400 may be attached to an end of each of the second circuit boards 600, but the disclosure is not limited thereto.

The circuit layer CCL includes a semiconductor layer 150, conductive layers, and insulating layers disposed on the first base substrate 110. The semiconductor layer 150 may include an oxide semiconductor. The conductive layers may include a first conductive layer 120, a second conductive layer 130, and a third conductive layer 140. The insulating layers may include a buffer layer 161, a gate insulator 162, an interlayer dielectric layer 163, a passivation layer 164, and a via layer 165.

The first conductive layer 120 is disposed on the first base substrate 110. The first conductive layer 120 may include a first lower conductive metal layer 121 electrically connected to the reference voltage line RVL, a second lower conductive metal layer 122 protecting a driving channel region 152 of the semiconductor layer 150, to be described later, from external light, a third lower conductive metal layer 123 electrically connected to the data line DTL, and a fourth lower conductive metal layer 124.

The first lower conductive metal layer 121 may be disposed in the second switching transistor region STRR2. The first lower conductive metal layer 121 may be in electrical contact with a first data conductive metal layer 141 through a contact hole CNT1 penetrating through the buffer layer 161 and the interlayer dielectric layer 163 to be described later. The first data conductive metal layer 141 may be a first source/drain electrode of the second switching transistor STR2. Accordingly, a reference voltage applied through the first lower conductive metal layer 121 electrically connected to the reference voltage line RVL may be applied to the first source/drain electrode of the second switching transistor STR2.

The second lower conductive metal layer 122 may be disposed in the driving transistor region DTRR. The second lower conductive metal layer 122 may be disposed under a channel region of the driving channel region 152 to cover at least the channel region of the driving channel region 152 and may cover the entire driving channel region 152. The second lower conductive metal layer 122 may be in electrical contact with the second data conductive metal layer 142 through a contact hole CNT2 penetrating through the buffer layer 161 and the interlayer dielectric layer 163. The second data conductive metal layer 142 may be the source electrode of the driving transistor DTR. Accordingly, the second lower conductive metal layer 122 can suppress a voltage change of the driving transistor DTR.

The third lower conductive metal layer 123 may be disposed in the first switching transistor region STRR1. The third lower conductive metal layer 123 may be in electrical contact with a fifth data conductive metal layer 145 through a contact hole CNT3 penetrating through the buffer layer 161 and the interlayer dielectric layer 163. The fifth data conductive metal layer 145 may be the second source/drain electrode of the first switching transistor STR1. Accordingly, the data voltage applied through the third lower conductive metal layer 123 electrically connected to the data line DTL may be applied to the second source/drain electrode of the first switching transistor STR1.

The fourth lower conductive metal layer 124 may be in electrical contact with a ninth data conductive metal layer 149 electrically connected to the second supply voltage line ELVSL through a contact hole CNT4 penetrating through the buffer layer 161 and the interlayer dielectric layer 163. As will be described later, the fourth lower conductive metal layer 124 can reduce a voltage drop of the second supply voltage applied to the common electrode CME.

The reference voltage line RVL and the data line DTL may also be included in the first conductive layer 120.

The first conductive layer 120 may be made up of, but is not limited to, a Ti/Cu double layer in which a titanium layer and a copper layer are stacked.

The buffer layer 161 may be disposed over the first substrate 120. The buffer layer 161 may be disposed to cover the entire surface of the first base substrate 110 on which the first conductive layer 120 is formed. The buffer layer 161 may include silicon nitride, silicon oxide, silicon oxynitride, or the like. According to an embodiment of the disclosure, the buffer layer 161 may include a double layer of SiNx/SiOX.

The semiconductor layer 150 is disposed on the buffer layer 161. The semiconductor layer 150 may include a second switching channel region 151 disposed in the second switching transistor region STR2 and forming a channel of the second switching transistor STR2, a driving channel region 152 disposed in the driving transistor region DTRR and forming a channel of the driving transistor DTR, and a first switching channel region 153 disposed in the first switching transistor region STR1 and forming a channel of the first switching transistor STR1.

A portion of the second switching channel region 151 may be in electrical contact with the first data conductive metal layer 141, which is the first source/drain electrode of the second switching transistor STR2, through a contact hole CNT5 penetrating through the interlayer dielectric layer 163. Another portion of the second switching channel region 151 along the second directional axis Y may be in electrical contact with a third data conductive metal layer 143, which is the second source/drain electrode of the second switching transistor STR2, through a contact hole CNT6 penetrating through the interlayer dielectric layer 163.

A portion of the driving switching channel region 152 may be in contact with the third data conductive metal layer 143, which is the source electrode of the driving transistor DTR, through a contact hole CNT7 penetrating through the interlayer dielectric layer 163. Another portion of the driving switching channel region 152 along the second directional axis Y may be in contact with a fourth data conductive metal layer 144, which is the drain electrode of the driving transistor DTR, through a contact hole CNT8 penetrating through the interlayer dielectric layer 163. The fourth data conductive metal layer 144 may be electrically connected to the first supply voltage line ELVDL.

A portion of the first switching channel region 153 may be in contact with the sixth data conductive metal layer 146, which is the first source/drain electrode of the first switching transistor STR1, through a contact hole CNT9 penetrating through the interlayer dielectric layer 163. Another portion of the first switching channel region 153 along the second directional axis Y may be in contact with an eighth data conductive metal layer 148, which is the second source/drain electrode of the first switching transistor STR1, through a contact hole CNT10 penetrating through the interlayer dielectric layer 163.

The semiconductor layer 150 may be made of a material including oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. According to an embodiment of the disclosure, the semiconductor layer 150 may include indium tin zinc oxide (IGZO).

The gate insulator 162 is disposed on the semiconductor layer 150. The gate insulator 162 may be formed in the same pattern as the second conductive layer 130 to be described above later. The sidewalls of the gate insulator 162 may be substantially aligned with the sidewalls of the second conductive layer 130, but the disclosure is not limited thereto. The gate insulator 162 may include a silicon compound, a metal oxide, etc. For example, the gate insulator 162 may include silicon oxide, silicon nitride, silicon oxynitride, aluminum oxide, tantalum oxide, hafnium oxide, zirconium oxide, titanium oxide, etc. According to an embodiment of the disclosure, the gate insulator 162 may include a SiOx film.

The second conductive layer 130 is disposed on the gate insulator 162. The second conductive layer 130 may include a first gate conductive metal layer 131 and a second gate conductive metal layer 132 disposed in the second switching transistor region STR2, a third gate conductive metal layer 133 disposed in the driving transistor region DTRR, a fourth gate conductive metal layer 134 disposed in the capacitor region CPR, a fifth gate conductive metal layer 135 disposed in the first switching transistor region STR1, and a sixth gate conductive metal layer 136 electrically connected to the ninth data conductive metal layer 149.

The first gate conductive metal layer 131 may be in electrical contact with the first data conductive metal layer 141 through a contact hole CNT11 penetrating through the interlayer dielectric layer 163. As described above, the first data conductive metal layer 141 may be in electrical contact with the first lower conductive metal layer 121 electrically connected to the reference voltage line RVL. The first gate conductive metal layer 131 can lower the resistance of the reference voltage line RVL to reduce a voltage drop of the reference voltage.

The second gate conductive metal layer 132 may be disposed in the second switching transistor region STR2 and may be the gate electrode of the second switching transistor STR2. The second gate conductive metal layer 132 may be in electrical contact with the second data conductive metal layer 142 electrically connected to the sensing signal line SSL through a contact hole CNT12 penetrating through the interlayer dielectric layer 163. Accordingly, the sensing signal applied from the sensing signal line SSL may be applied to the second gate conductive metal layer 132 through the second data conductive metal layer 142.

The third gate conductive metal layer 133 may be disposed in the driving transistor region DTRR and may be the gate electrode of the driving transistor DTR. Although not shown in the drawings, the third gate conductive metal layer 133 may be in electrical contact with the sixth data conductive metal layer 146 that is the first source/drain electrode of the first switching transistor STR1.

The fourth gate conductive metal layer 134 may be disposed in the capacitor region CPR. The fourth gate conductive metal layer 134 may form the fifth data conductive metal layer 145 and the first storage capacitor CST1, and may be a first electrode (or a lower electrode) of the first storage capacitor CST1. The fourth gate conductive metal layer 134 may form the second lower conductive metal layer 122 and the second storage capacitor CST2, and may be a second electrode (or an upper electrode) of the second storage capacitor CST2. The fourth gate conductive metal layer 134 may be in electrical contact with the sixth data conductive metal layer 146 through a contact hole CNT13 penetrating through the interlayer dielectric layer 163.

The first and second storage capacitors CST1 and CST2 described above may form a single storage together with the third storage capacitor CST3 formed by the fifth data conductive metal layer 145 and the second lower conductive metal layer 122 to be described later.

The fifth gate conductive metal layer 135 may be disposed in the first switching transistor region STRR1 and may be the gate electrode of the first switching transistor STR1. The fifth gate conductive metal layer 135 may be in electrical contact with the seventh data conductive metal layer 147 electrically connected to the scan line SCL through a contact hole CNT13 penetrating through the interlayer dielectric layer 163. Accordingly, the scan signal applied from the scan line SCL may be applied to the fifth gate conductive metal layer 135 through the seventh data conductive metal layer 147.

The sixth gate conductive metal layer 136 may be in electrical contact with the ninth data conductive metal layer 149 electrically connected to the second supply voltage line ELVSL through a contact hole CNT15 penetrating through the interlayer dielectric layer 163. As will be described later, the sixth gate conductive metal layer 136 can reduce a voltage drop of the second supply voltage applied to the common electrode CME.

The second conductive layer 130 may be made up of a single film or multiple films. The second conductive layer 130 may be made of a low resistance material. The second conductive layer 130 may include, but is not limited to, a material such as copper (Cu), molybdenum (Mo), aluminum (Al), and silver (Ag).

The interlayer dielectric layer 163 is disposed on the second conductive layer 130. The interlayer dielectric layer 163 in which the second conductive layer 130 is formed may include an inorganic insulating material such as silicon oxide, silicon nitride, silicon oxynitride, hafnium oxide, aluminum oxide, titanium oxide, tantalum oxide and zinc oxide. According to an embodiment of the disclosure, the interlayer dielectric layer 163 may include a SiON.

The third conductive layer 140 is disposed on the interlayer dielectric layer 163. The third conductive layer 140 may include the first to ninth data conductive metal layers 141 to 149 disposed in the display area DPA and a contact pads CPD and a wire pads WPD disposed in the pad area PDA of the non-display area NDA.

The first data conductive metal layer 141 may be disposed in the second switching transistor region STRR2. The first data conductive metal layer 141 may be in electrical contact with the first lower conductive metal layer 121 electrically connected to the reference voltage line RVL through the contact hole CNT1. The first data conductive metal layer 141 may be in electrical contact with the first gate conductive metal layer 131 through the contact hole CNT11. The first data conductive metal layer 141 may be in electrical contact with the second switching channel region 151 of the semiconductor layer 150 through the contact hole CNT5, and may be the first source/drain electrode of the second switching transistor STR2.

The second data conductive metal layer 142 may be disposed in the second switching transistor region STRR2. The second data conductive metal layer 142 may be electrically connected to the sensing signal line SSL. The second data conductive metal layer 142 may be in electrical contact with the second gate conductive metal layer 132, which is the gate electrode of the second switching transistor STR2, through the contact hole CNT12.

At least a part of the third data conductive metal layer 143 may be disposed in the second switching transistor region STR2 and the driving transistor region DTRR. The third data conductive metal layer 143 may be in electrical contact with the second switching channel region 151 of the semiconductor layer 150 through the contact hole CNT6, and may be the second source/drain electrode of the second switching transistor STR2. The third data conductive metal layer 143 may be in electrical contact with the second lower conductive metal layer 122 through the contact hole CNT2. The third data conductive metal layer 143 may be in electrical contact with the driving channel region 152 of the semiconductor layer 150 through the contact hole CNT7 and may be the source electrode of the driving transistor DTR. The third data conductive metal layer 143 may electrically contact the pixel electrode PXE through the contact hole CNT16 penetrating through the passivation layer 164 and the via layer 165.

The fourth data conductive metal layer 144 may be disposed in the driving transistor region DTRR. The fourth data conductive metal layer 144 may be in electrical contact with the driving channel region 152 of the semiconductor layer 150 through the contact hole CNT8 and may be the drain electrode of the driving transistor DTR. The fourth data conductive metal layer 144 may be electrically connected to the first supply voltage line ELVDL. Accordingly, the first supply voltage applied from the first supply voltage ELVDL may be applied to the fourth data conductive metal layer 144, which is the drain electrode of the driving transistor DTR.

The fifth data conductive metal layer 145 may be disposed in the capacitor region CPR. The fifth data conductive metal layer 145 may form the fourth gate conductive metal layer 134 and the capacitor CST1, and may be the second electrode (or the upper electrode) of the first storage capacitor CST1. The fifth data conductive metal layer 145 may form the second lower conductive metal layer 122 and the third storage capacitor CST3, and may be a second electrode (or an upper electrode) of the third storage capacitor CST3.

At least a part of the sixth data conductive metal layer 146 may be disposed in the capacitor region CPR and the first switching transistor region STR1. The sixth data conductive metal layer 146 may be in electrical contact with the fourth gate conductive metal layer 134 through the contact hole CNT13. The sixth data conductive metal layer 146 may be in electrical contact with the first switching channel region 153 of the semiconductor layer 150 through the contact hole CNT9, and may be the first source/drain electrode of the first switching transistor STR1.

The seventh data conductive metal layer 147 may be disposed in the first switching transistor region STRR1. The seventh data conductive metal layer 147 may be electrically connected to the scan line SCL. The seventh data conductive metal layer 147 may be in electrical contact with the fifth gate conductive metal layer 135, which is the gate electrode of the first switching transistor STR1, through the contact hole CNT14. Accordingly, the scan signal applied from the scan line SCL may be applied to the fifth gate conductive metal layer 135, which is the gate electrode of the first switching transistor STR1, through the seventh data conductive metal layer 147.

The eighth data conductive metal layer 148 may be disposed in the first switching transistor region STRR1. The eighth data conductive metal layer 148 may be in electrical contact with the first switching channel region 153 of the semiconductor layer 150 through the contact hole CNT10, and may be the second source/drain electrode of the first switching transistor STR1. The eighth data conductive metal layer 148 may be in electrical contact with the third lower conductive metal layer 123 electrically connected to the data line DTL through the contact hole CNT3. Accordingly, the data signal applied from the data line DTL may be applied to the eighth data conductive metal layer 148, which is the second source/drain electrode of the first switching transistor STR1, through the third lower conductive metal layer 123.

The ninth data conductive metal layer 149 may be electrically connected to the second supply voltage line ELVSL. The ninth data conductive metal layer 149 may be in electrical contact with the fourth lower conductive metal layer 124 through the contact hole CNT4, and may be in contact with the sixth gate conductive metal layer 136 through the contact hole CNT15. The ninth data conductive metal layer 149 may be in electrical contact with the common electrode CME through the contact hole CNT17 penetrating through the passivation layer 164, the via layer 165 and the light emitting layer EML.

The wire pads WPD may be disposed to overlap the first circuit boards 400 in the pad area PDA of the non-display area NDA. The first circuit boards 400 may be attached to the wire pads WPD. For example, a first bump 410 disposed on one side of the first circuit board 400 may be attached to a wire pad WPD by an anisotropic conductive film ACF. A first bump 410 may be attached to a wire pad WPD by an anisotropic conductive film ACF through contact hole CNT18 penetrating through the passivation layer 164 in the pad area PDA. As described above, a side of a first circuit board 400 may be disposed on the pad area PDA of the first display substrate 100, while another side of a first circuit board may be bent so that it is spaced apart from the auxiliary conductive layer 180 along the third directional axis Z. The first circuit boards 400 may overlap the pad area PDA of the non-display area NDA and the display area DPA of the first display substrate 100. As described above, the driving chip 500 may be mounted on a first circuit board 400.

A second circuit board 600 may be disposed on a second bump 420 disposed on the opposite side of a first circuit board 400 from the side that attaches to the first display substrate 100. For example, a third bump 610 disposed on a side of a second circuit board 600 may be attached to a second bump 420 by an anisotropic conductive film ACF. The second circuit board 600 may be spaced apart from the auxiliary conductive layer 180 along the third directional axis Z. The second circuit board 600 may overlap the pad area PDA of the non-display area NDA and the display area DPA of the first display substrate 100.

There may be contact pads CPD, which may be arranged along the first directional axis X in the pad area PDA of the non-display area NDA. The contact pads CPD may not overlap with the first circuit boards 400. For example, the contact pads CPD may be disposed between the first circuit boards 400 in the pad area PDA. The contact pads CPD may be electrically connected to the ninth data conductive metal layer 149 electrically connected to the second supply voltage ELVSL. The contact pads CPD may be electrically connected to the auxiliary conductive layer 180 disposed on the opposite surface of the first base substrate 110 through the connection conductive layers CTL. The contact pads CPD may be in electrical contact with the connection conductive layers CTL. The contact pads CPD may be in electrical contact with the connection conductive layers CTL through the contact hole CNT19 penetrating through the passivation layer 164 in the pad area PDA.

The sensing signal line SSL (e.g., the second data conductive metal layer 142), the first supply voltage line ELVDL (e.g., the fourth data conductive metal layer 144) and/or the second supply voltage line ELVSL (e.g., the ninth data conductive metal layer 149) may be formed as the third conductive layer 140.

The third conductive layer 140 may be made of a low resistance material. The third conductive layer 140 may include, but is not limited to, a material such as copper (Cu), aluminum (Al), silver (Ag) and molybdenum (Mo). According to an embodiment of the disclosure, the third conductive layer 140 may include a triple film of Ti/Cu/ZIO or may have a stack structure of Ti/Cu/Ti/Mo/ITO. The stack material and stack structure of the third conductive layer 140 and the second conductive layer 130 may be the same, but the disclosure is not limited thereto.

The passivation layer 164 is disposed over the third conductive layer 140. The passivation layer 164 covers and protects the third conductive layer 140. The passivation layer 164 may include an inorganic insulating material such as silicon oxide, silicon nitride, silicon oxynitride, hafnium oxide, aluminum oxide, titanium oxide, tantalum oxide and zinc oxide.

The via layer 165 is disposed on the passivation layer 164. The via layer 165 may be disposed to partially cover the upper surface of the passivation layer 164. The via layer 165 may be formed in the display area DPA, and may not be formed in the non-display area NDA at least partially. The via layer 165 is at least not formed on the contact pads CPD of the pad area PDA, and thus may not overlap with the contact pads CPD.

The via layer 165 may include an organic insulating material such as polyacrylate resin, epoxy resin, phenolic resin, polyamide resin, polyimide resin, unsaturated polyesters resin, polyphenylene ether resin, polyphenylene sulfide resin, and benzocyclobutene (BCB). The via layer 165 may further include, but is not limited to, a photosensitive material. According to an embodiment of the disclosure, the via layer 165 may include polyimide.

The pixel electrode PXE is disposed on the via layer 165. The material forming the pixel electrode PXE has been described above with reference to FIG. 2. According to an embodiment of the disclosure, the pixel electrode PXE may be made up of a triple layer of ITO/Ag/ITO.

The pixel electrode PXE may be disposed in the display area DPA but not in the non-display area NDA. The pixel electrode PXE may overlap the transistor regions DTRR, STRR1 and STRR2 and the capacitor region CPR of the display area DPA, but the disclosure is not limited thereto. The pixel electrode PXE may be in electrical contact with the third data conductive metal layer 143, which is the source electrode of the driving transistor DTR, through the contact hole CNT16 penetrating through the passivation layer 164 and the via layer 165.

The pixel-defining layer PDL is disposed on the pixel electrode PXE. The pixel-defining layer PDL may be disposed in the display area DPA but not in the non-display area NDA. The pixel-defining layer PDL may be disposed to overlap the edge of the pixel electrode PXE. The pixel-defining layer PDL may also be disposed on the via layer 165 where the pixel electrode PXE is not formed. The pixel-defining layer PDL may include an organic insulating material such as polyacrylate resin, epoxy resin, phenolic resin, polyamide resin, polyimide resin, unsaturated polyesters resin, poly phenylene ether resin, poly phenylene sulfide resin, and benzocyclobutene (BCB). The pixel-defining layer PDL may include an inorganic material.

The light emitting layer EML is disposed on the pixel electrode PXE and the pixel-defining layer PDL, the common electrode CME is disposed on the light emitting layer EML, and the encapsulation structure 170 is disposed on the common electrode CME. The light emitting layer EML, the common electrode CME and the encapsulation structure 170 may be entirely disposed in the display area DPA of the first display substrate 100. The light emitting layer EML, the common electrode CME and the encapsulation structure 170 have been described above with reference to FIG. 2, and therefore, the redundant descriptions will be omitted.

The connection conductive layers CTL may be disposed at an end of the first display substrate 100 with respect to the second directional axis Y. The connection conductive layers CTL may be disposed to surround the upper surface, side surfaces and lower surface of the end of the first display substrate 100 in the second directional axis Y. One side of the connection conductive layers CTL may be in contact with the contact pads CPD, and the opposite side thereof may be in contact with the auxiliary conductive layer 180 disposed on the opposite surface of the first base substrate 110. Therefore, the connection conductive layers CTL may electrically connect the contact pads CPD with the auxiliary conductive layer 180.

As shown in FIG. 4, there may be connection conductive layers CTL, which may be arranged along the first directional axis X. The connection conductive layers CTL may have a pattern shape separated from each other. The connection conductive layers CTL may not overlap the first circuit boards 400. The connection conductive layers CTL may be disposed between the first circuit boards 400 and may not interfere with the first circuit boards 400. The connection conductive layers CTL may be in contact with the upper, the side surfaces and the lower surface of the end of the first display substrate 100 where the pad area PDA is disposed. The connection conductive layers CTL may be in contact with the upper and side surfaces of the passivation layer 164, the side surface of the interlayer dielectric layer 163, the side surface of the buffer layer 161, the side surface of the first base substrate 110, and the side and lower surfaces of the auxiliary conductive layer 180 in the pad area PDA. However, the disclosure is not limited thereto.

The connection conductive layers CTL may include a conductive material. For example, the connection conductive layers CTL may include a metal paste or a conductive tape. When the connection conductive layers CTL include a metal paste, it may be formed by using a silk screen printing technique, but the disclosure is not limited thereto.

According to the embodiment of the disclosure, the display device 1 includes the first display substrate 100 including the connection conductive layers CTL, so that the voltage drop of the second supply voltage applied to the common electrode CME can be reduced. For example, the second supply voltage may be applied from the second supply voltage line ELVSL to the common electrode CME through the ninth data conductive metal layer 149, and the contact pads CPD may be electrically connected to the ninth data conductive metal layer 149 electrically connected to the second supply voltage line ELVSL. The connection conductive layer CTL may also be in electrical contact with the contact pads CPD and the auxiliary conductive layer 180, to electrically connect the contact pads CPD with the auxiliary conductive layer 180. Accordingly, the ninth data conductive metal layer 149, the contact pads CPD and the connection conductive layers CTL electrically connect the auxiliary conductive layer 180 with the common electrode CME, so that the voltage drop of the second supply voltage applied to the common electrode CME can be reduced. The auxiliary conductive layer 180 is disposed on the opposite surface of the first base substrate 110 and may include a large area. The voltage drop of the second supply voltage can be effectively reduced.

According to an embodiment of the disclosure, the auxiliary conductive layer 180 of the display device 1 can block electromagnetic waves applied from the outside to protect the circuit layer CCL included in the display device 1. The auxiliary conductive layer 180 can prevent the accumulation of electric charges, thereby preventing the generation of static electricity. The auxiliary conductive layer 180 can block light illuminated to the semiconductor layer 150 from the outside, to prevent the semiconductor layer 150 from being exposed to light. The auxiliary conductive layer 180 may also have heat dissipation properties and may prevent the display device from being overheated.

Hereinafter, a first display substrate 100_1 according to another embodiment of the disclosure will be described. The first display substrate 100_1 according to this embodiment is substantially identical to the first display substrate 100 and, therefore, description will focus on the differences and repetitive descriptions will be omitted.

Figure 7:
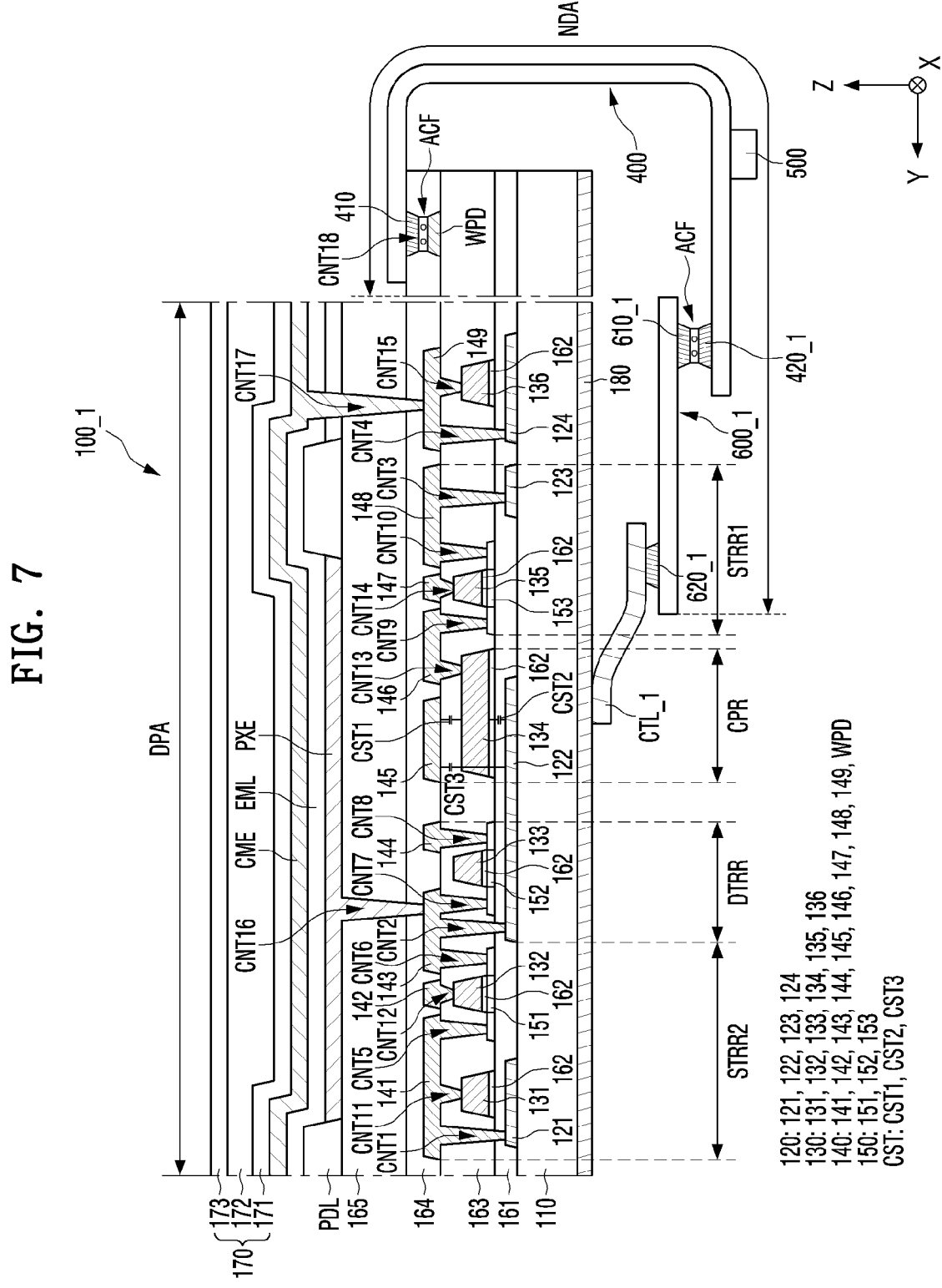
FIG. 7 is a schematic cross-sectional view of the first display substrate of the display device of FIG. 4 according to another embodiment.

FIG. 7 is a cross-sectional view of a first display substrate 100_1 according to an embodiment which corresponds to the first display substrate 100 of the display device 1 of FIG. 4.

The first display substrate 100_1 according to the embodiment of FIG. 7 is different from the first display substrate 100 in that the first circuit boards 400 are attached to a wire pads WPD, and that connection conductive layers CTL_1 are in electrical contact with the second circuit boards 600_1 and an auxiliary conductive layer 180.

According to this embodiment of the disclosure, one side of a first circuit board 400 may be attached to a wire pad WPD. For example, a first bump 410 of the first circuit board 400 may be attached to a wire pad WPD by an anisotropic conductive film ACF. A second circuit board 600_1 may be attached to the other side of the first circuit board 400.

The connection conductive layer CTL_1 may be disposed between the second circuit board 600_1 and the auxiliary conductive layer 180. The second circuit board 600_1 may further include a fourth bump 620_1, and one side of the connection conductive layer CTL_1 may be attached to the fourth bump 620_1 of the second circuit board 600_1. The opposite side of the connection conductive layer CTL_1 may be in electrical contact with the lower surface of the auxiliary conductive layer 180.

The connection conductive layer CTL_1 may be disposed for each second circuit board 600_1, but the disclosure is not limited thereto. Connection conductive layers CTL_1 may be disposed for each second circuit board 600_1 or one connection conductive layer CTL_1 may be disposed for multiple second circuit boards 600_1.

Accordingly, the wire pads WPD may be electrically connected to the ninth data conductive metal layer 149 electrically connected to the common electrode CME, and the wire pads WPD may be electrically connected to the connection conductive layer CTL_1 through the first circuit board 400 and the second circuit board 600_1. Since the connection conductive layer CTL_1 may be in contact with the auxiliary conductive layer 180, the common electrode CME may be electrically connected to the auxiliary conductive layer 180.

According to this embodiment, the first display substrate 100_1 can reduce the voltage drop of the second supply voltage applied to the common electrode CME through the auxiliary conductive layer 180 and the connection conductive layer CTL_1 electrically connecting the auxiliary conductive layer 180 with the common electrode CME. For example, the second supply voltage may be applied from the second supply voltage line ELVSL to the common electrode CME through the ninth data conductive metal layer 149, and a wire pad WPD may be electrically connected to the ninth data conductive metal layer 149 electrically connected to the second supply voltage line ELVSL. The connection conductive layers CTL_1 may be in contact with the second circuit board 600_1 and the auxiliary conductive layer 180, to electrically connect the wire pad WPD with the auxiliary conductive layer 180. Accordingly, the ninth data conductive metal layer 149, the wire pads WPD and the connection conductive layers CTL_1 electrically connect the auxiliary conductive layer 180 with the common electrode CME, so that the voltage drop of the second supply voltage applied to the common electrode CME can be reduced.

According to this embodiment, the first display substrate 100_1 includes the auxiliary conductive layer 180 that blocks electromagnetic waves and static electricity applied from the outside, prevents the semiconductor layer 150 from being exposed to light and has heat dissipation properties, and thus the reliability of the display device 1 including the first display substrate 100_1 can be improved.

The connection conductive layer CTL_1 of the first display substrate 100_1 according to this embodiment is disposed between the second circuit board 600_1 and the auxiliary conductive layer 180, to facilitate electrical connection between the common electrode CME and the auxiliary conductive layers 180 in a narrow space.

Figure 8:
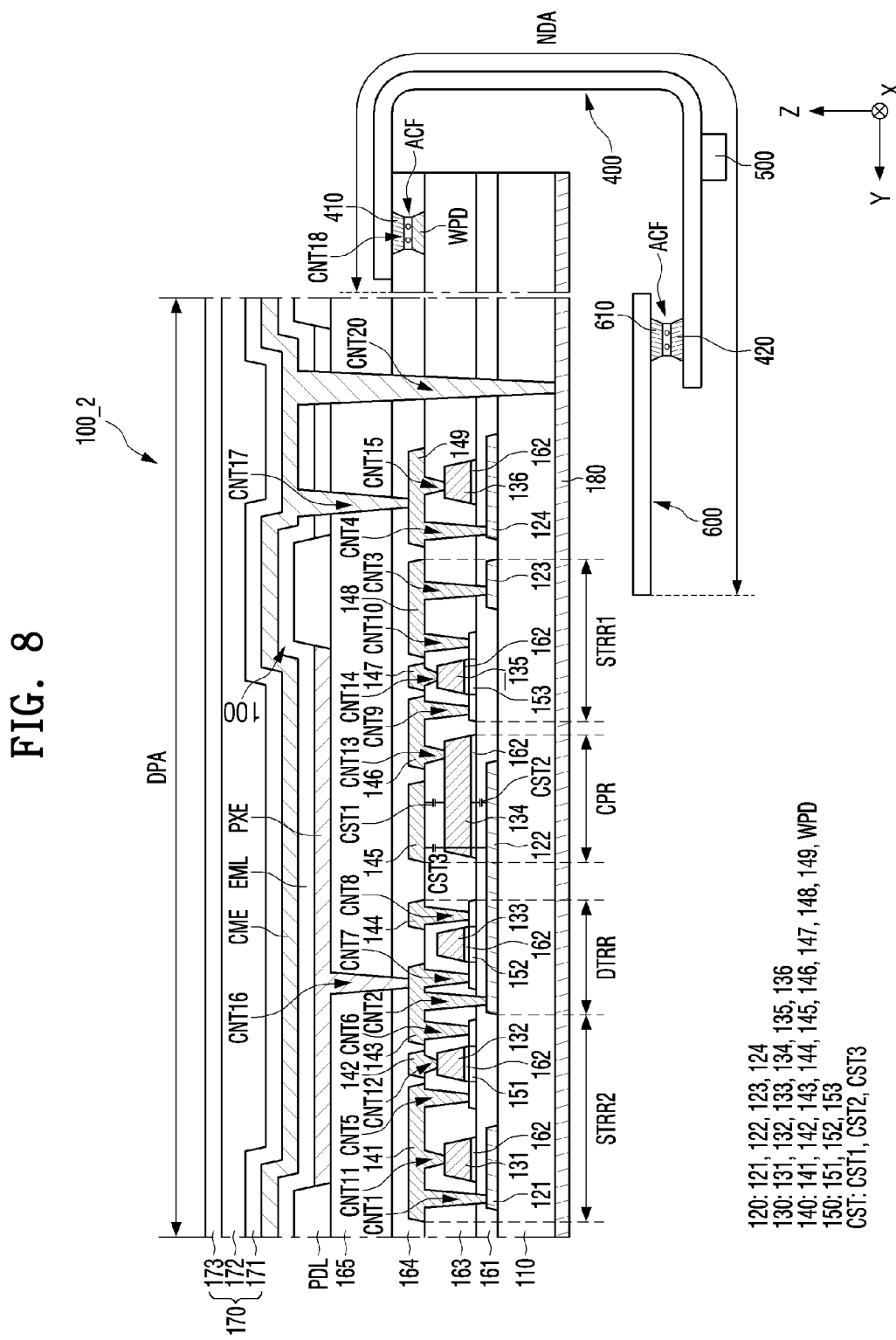
FIG. 8 is a schematic cross-sectional view of the first display substrate of the display device of FIG. 4 according to yet another embodiment.

FIG. 8 is a cross-sectional view of the first display substrate of the display device of FIG. 4 according to yet another embodiment.

A first display substrate 100_2 according to this embodiment is different from the first display substrate 100 according to the above embodiment in that a common electrode CME is electrically connected to auxiliary conductive layer 180 through a contact hole CNT20 penetrating through a light emitting layer EML, a via layer 165, a passivation layer 164, an interlayer dielectric layer 163, a buffer layer 161 and a first base substrate 110. The contact holes CNT20 may be formed in each of the pixels PX, but the disclosure is not limited thereto. In other examples, the contact holes CNT20 may be formed in some of the pixels PX according to a pattern. The diameter of a contact hole CNT20 may be approximately 10 μm. The contact holes CNT20 may be formed in a location of the display area DPA other than the transistor regions DTRR, STRR1 and STRR2. The contact hole CNT20 may avoid penetrating the electrodes forming the transistors DTR, STR1 and STR2. In other examples, contact hole CNT20 may be formed in the non-display area NDA. For example, the contact holes CNT20 may be formed in the pad area PDA.

According to this embodiment, the first display substrate 100_2 can reduce the voltage drop of the second supply voltage applied to the common electrode CME through the auxiliary conductive layer 180 and the contact hole CNT20 bringing the common electrode CME into electrical contact with the auxiliary conductive layer 180.

According to this embodiment, the first display substrate 100_2 includes the auxiliary conductive layer 180 that blocks electromagnetic waves and static electricity applied from the outside, prevents the semiconductor layer 150 from being exposed to light and has heat dissipation properties. Thus, the reliability of the display device 1 including the first display substrate 100_2 can be improved.

According to this embodiment, direct contact between the common electrode CME and the auxiliary conductive layer 180 is implemented through the contact hole CNT20 in the first display substrate 100_2, such that it is possible to check for contact failures in the first display substrate 100_2 and cope with any such failures.

Figure 9:
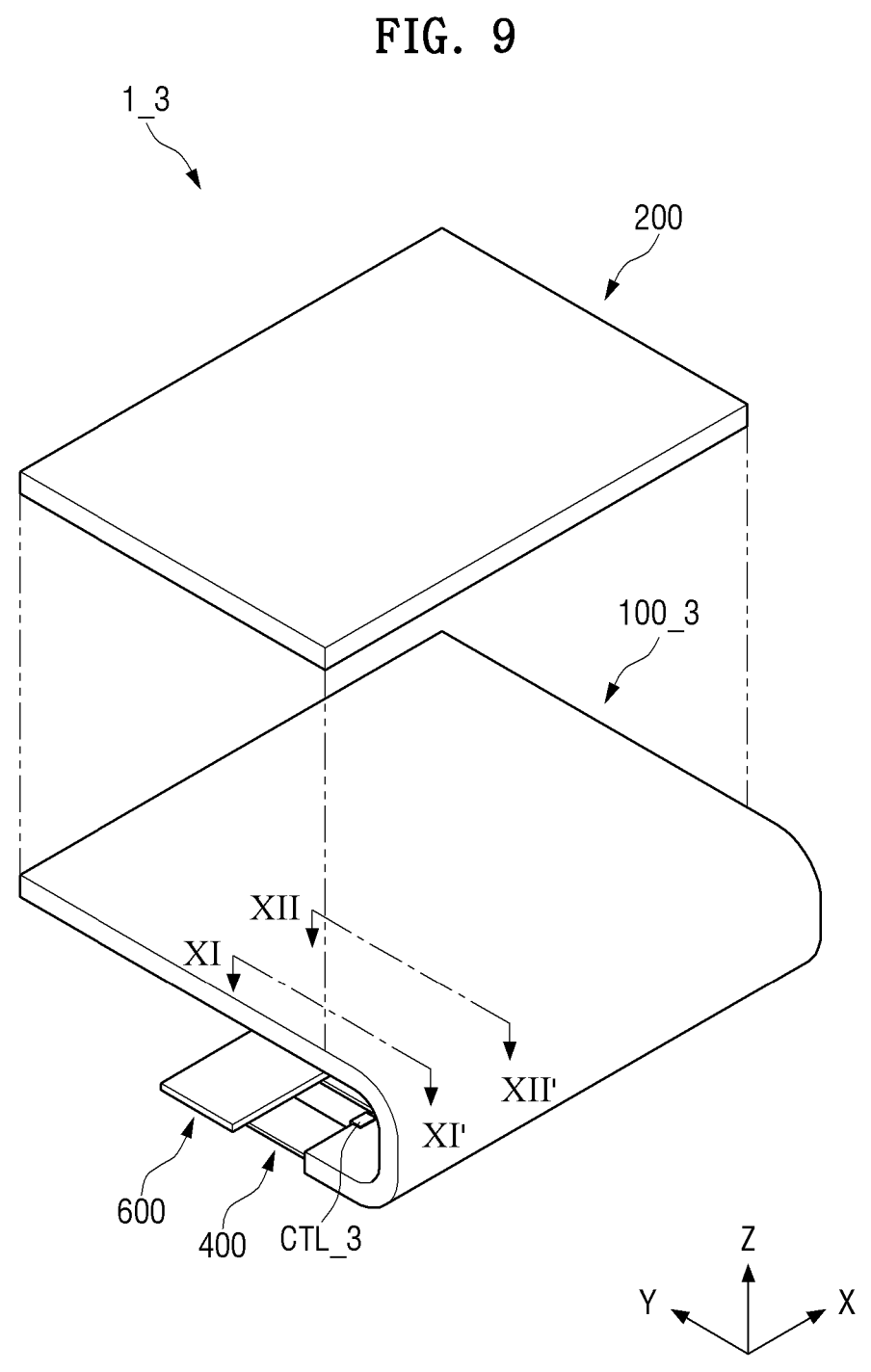
Figure 10:
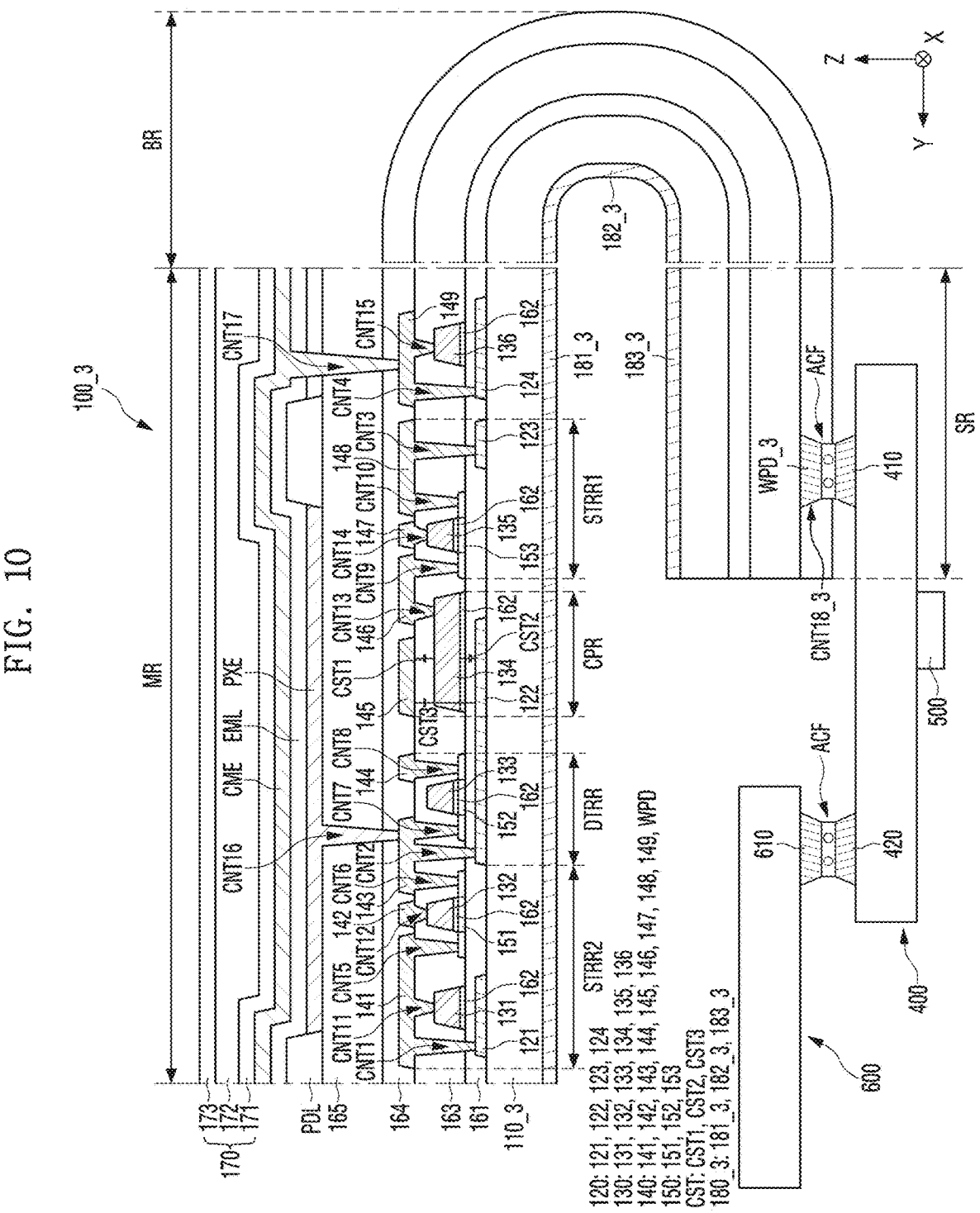
FIG. 10 is a schematic cross-sectional view of the first display substrate, taken along line XI-XI' of FIG. 9.

FIG. 9 is an exploded schematic perspective view of a display device 1_3 according to another embodiment of the disclosure. FIG. 10 is a schematic cross-sectional view of the first display substrate, taken along line XI-XI' of FIG. 9. FIG. 11 is a schematic cross-sectional view of the first display substrate, taken along line XII-XII' of FIG. 9 that includes a cross-sectional view of a connection conductive layer CTL_3.

Referring to FIGS. 9 to 11, a display device 1_3 according to this embodiment may include a first display substrate 100_3 including a first base substrate 110_3 that is a flexible substrate.

The first display substrate 100_3 may include a main region MR and a bending region BD connected to one side of the main region MR. The first display substrate 100_3 may further include a subsidiary region SR connected to the bending region BD and overlapping the main region MR in the thickness direction.

The display area of the first display substrate 100_3 falls within the main region MR. According to an embodiment of the disclosure, the edge of the display area in the main region MR, the entire bending region BR and the entire subsidiary region SR may be the non-display area of the first display substrate 100_3. It is, however, to be understood that the disclosure is not limited thereto. The bending region BD and/or the subsidiary region SR may also include the display area.

In the main region MR, the non-display area may be located around the display area. The non-display area of the main region MR may be extended from the outer border of the display area to the edge of the first display substrate 100_3. In the non-display area of the main region MR, signal lines for applying signals to the display area or driving circuits may be disposed.

In the bending region BR, the first display substrate 100_3 may be bent downward in the thickness direction, i.e., in the direction away from the display surface with a curvature. Although the bending region BD may have a constant radius of curvature, the disclosure is not limited thereto. It may have different radii of curvature for difference sections. As the first display substrate 100_3 is bent in the bending region BD, the surface of the first display substrate 100_3 is inverted. A surface of the first display substrate 100_3 facing the side indicated by the third directional axis Z may face the opposite side of the second directional axis Y in the bending region BD and then may face the opposite side of the third directional axis Z.

The subsidiary region SR is extended from the bending region BD. The subsidiary region SR may be extended in a direction parallel to the main region MR from the end of the bending region. The subsidiary region SR may overlap with the main region MR in the thickness direction of the first display substrate 100_3. The subsidiary region SR may overlap with the non-display area at the edge of the main region MR and may also overlap with the display area of the main region MR. The width of the subsidiary region SR may be, but is not limited to being, equal to the width of the bending region BD.

An auxiliary conductive layer 180_3 included in the first display substrate 100_3 according to this embodiment may include a first conductive portion 181_3 disposed in the main region MR, a second conductive portion 182_3 disposed in the bending region BR, and a third conductive portion 183_3 disposed in the subsidiary region SR.

A pad area PDA may be provided at an end of the subsidiary region SR of the first display substrate 100_3, and first circuit boards 400 may be attached on the pad area PDA. The first circuit boards 400 may be arranged such that they are spaced apart from one another along the first directional axis X. Connection conductive layers CTL_3 may be disposed between the first circuit boards 400. A first end of each of the first circuit boards 400 may be attached to the end of the subsidiary region SR of the first display substrate 100_3, while a second end of the first circuit boards 400 may be attached to the second circuit boards 600.

The second circuit boards 600 may be attached to the second ends of the first circuit boards 400. The second circuit boards 600 may overlap the main region MR of the first display substrate 100_3. First circuit boards 400 may be attached to one end of each of the second circuit boards 600, but the disclosure is not limited thereto.

Wire pads WPD_3 may be disposed to overlap the first circuit boards 400 in the pad area PDA. A first circuit board 400 may be attached to a wire pad WPD_3. For example, a first bump 410 disposed on one side of the first circuit board 400 may be attached to the wire pad WPD_3 by an anisotropic conductive film ACF. The first bump 410 may be attached to the wire pad WPD_3 by the anisotropic conductive film ACF through a contact hole CNT18_3 penetrating through the passivation layer 164 in the pad area PDA. As described above, one side of a first circuit board 400 may be disposed on the pad area PDA of the first display substrate 100_3, while the other side of the first circuit board 400 may be bent so that it is spaced apart from the auxiliary conductive layer 180_3 on the opposite side of the third directional axis Z. The first circuit board 400 may overlap the pad area PDA of the non-display area NDA and the display area DPA of the first display substrate 100_3. As described above, the driving chip 500 may be mounted on the first circuit board 400.

A second circuit board 600 may be disposed on a second bump 420 disposed on the opposite side of a first circuit board 400. For example, a third bump 610 disposed on one side of the second circuit board 600 may be attached to the second bump 420 by an anisotropic conductive film ACF.

The second circuit board 600 may be spaced apart from the auxiliary conductive layer 180_3 in the third direction. The second circuit board 600 may overlap the pad area PDA of the non-display area NDA and the display area DPA of the first display substrate 100_3.

There may be contact pads CPD_3, which may be arranged along the first directional axis X in the pad area PDA of the non-display area NDA. The contact pads CPD_3 may not overlap with the first circuit boards 400. For example, the contact pads CPD_3 may be disposed between the first circuit boards 400 in the pad area PDA. The contact pads CPD_3 may be electrically connected to the ninth data conductive metal layer 149 electrically connected to the second supply voltage ELVSL. The contact pads CPD_3 may be electrically connected to the auxiliary conductive layer 180_3 disposed on the opposite surface of the first base substrate 110_3 through the connection conductive layers CTL_3. The contact pads CPD_3 may be in electrical contact with the connection conductive layers CTL_3. The contact pads CPD_3 may be in electrical contact with the connection conductive layers CTL_3 through a contact hole CNT19_3 penetrating through the passivation layer 164 in the pad area PDA.

The connection conductive layers CTL_3 may be disposed at the end of the subsidiary region SR of the first display substrate 100_3. The connection conductive layers CTL_3 may be disposed to surround the upper surface, side surfaces and lower surface of the subsidiary region SR of the first display substrate 100_3. One side of the connection conductive layers CTL_3 may be in electrical contact with the contact pad CPD_3, and the opposite side thereof may be in electrical contact with the auxiliary conductive layer 180_3 disposed on the opposite surface of the first base substrate 110_3. The connection conductive layers CTL_3 may electrically connect the contact pads CPD_3 with the auxiliary conductive layer 180_3. As shown in FIG. 9, there may be connection conductive layers CTL_3, which may be arranged along the first directional axis X. The connection conductive layers CTL_3 may not overlap the first circuit boards 400. The connection conductive layers CTL_3 may be disposed between the first circuit boards 400. The connection conductive layers CTL_3 may be in contact with the upper, the side surfaces and the lower surface of the end of the first display substrate 100_3 where the pad area PDA is disposed. The connection conductive layers CTL_3 may be in contact with the upper and side surfaces of the passivation layer 164, the side surface of the interlayer dielectric layer 163, the side surface of the buffer layer 161, the side surface of the first base substrate 110_3, and the side and upper surfaces of the third conductive portion 183_3 of the auxiliary conductive layer 180_3 located at the end of the subsidiary region SR of the first display substrate 100_3. However, the disclosure is not limited thereto.

Hereinafter, a method of fabricating the first display substrate 100_3 according to this embodiment will be described. According to this embodiment, an auxiliary conductive layer 180_3 may be formed on a carrier substrate (not shown) of the first display substrate 100_3, and a flexible material may be applied onto the auxiliary conductive layer 180_3 to form a first base substrate 110_3. For example, the flexible material may be, but is not limited to, polyimide (PI). Once the first base substrate 110_3 is formed, a first conductive layer 120, a buffer layer 161, a semiconductor layer 150, a gate insulator 162, a second conductive layer 130, an interlayer dielectric layer 163, a third conductive layer 140, a passivation layer 164, a via layer 165, a pixel electrode PXE, a light emitting layer EML, a common electrode CME, and an encapsulation structure 170 may be stacked on one another sequentially. Subsequently, in the pad area PDA, the carrier substrate (not shown) may be partially separated from the auxiliary conductive layer 180_3. After separating the auxiliary conductive layer 180_3 of the pad area PDA from the carrier substrate (not shown), a connection conductive layer CTL_3 may be formed at the end of the first display substrate 100_3 by deposition, and then the carrier substrate (not shown) may be completely separated from the auxiliary conductive layer 180_3.

According to the embodiment of the disclosure, the display device 1_3 includes the first display substrate 100_3 including connection conductive layers CTL_3, so that the voltage drop of the second supply voltage applied to the common electrode CME can be reduced. For example, the second supply voltage may be applied from the second supply voltage line ELVSL to the common electrode CME through the ninth data conductive metal layer 149, and the contact pads CPD_3 may be electrically connected to the ninth data conductive metal layer 149 electrically connected to the second supply voltage line ELVSL. The connection conductive layer CTL_3 may be in electrical contact with the contact pad CPD_3 and the auxiliary conductive layer 180_3, to electrically connect the contact pad CPD_3 with the auxiliary conductive layer 180_3. Accordingly, the ninth data conductive metal layer 149, the contact pad CPD_3 and the connection conductive layer CTL_3 electrically connect the auxiliary conductive layer 180_3 with the common electrode CME, so that the voltage drop of the second supply voltage applied to the common electrode CME can be reduced.

According to the embodiment, the display device 1_3 includes the auxiliary conductive layer 180_3 which may block electromagnetic waves and static electricity applied from the outside, may prevent the semiconductor layer 150 from being exposed to light and may have heat dissipation properties. Thus, the reliability of the display device 1_3 may be improved.

Figure 12:
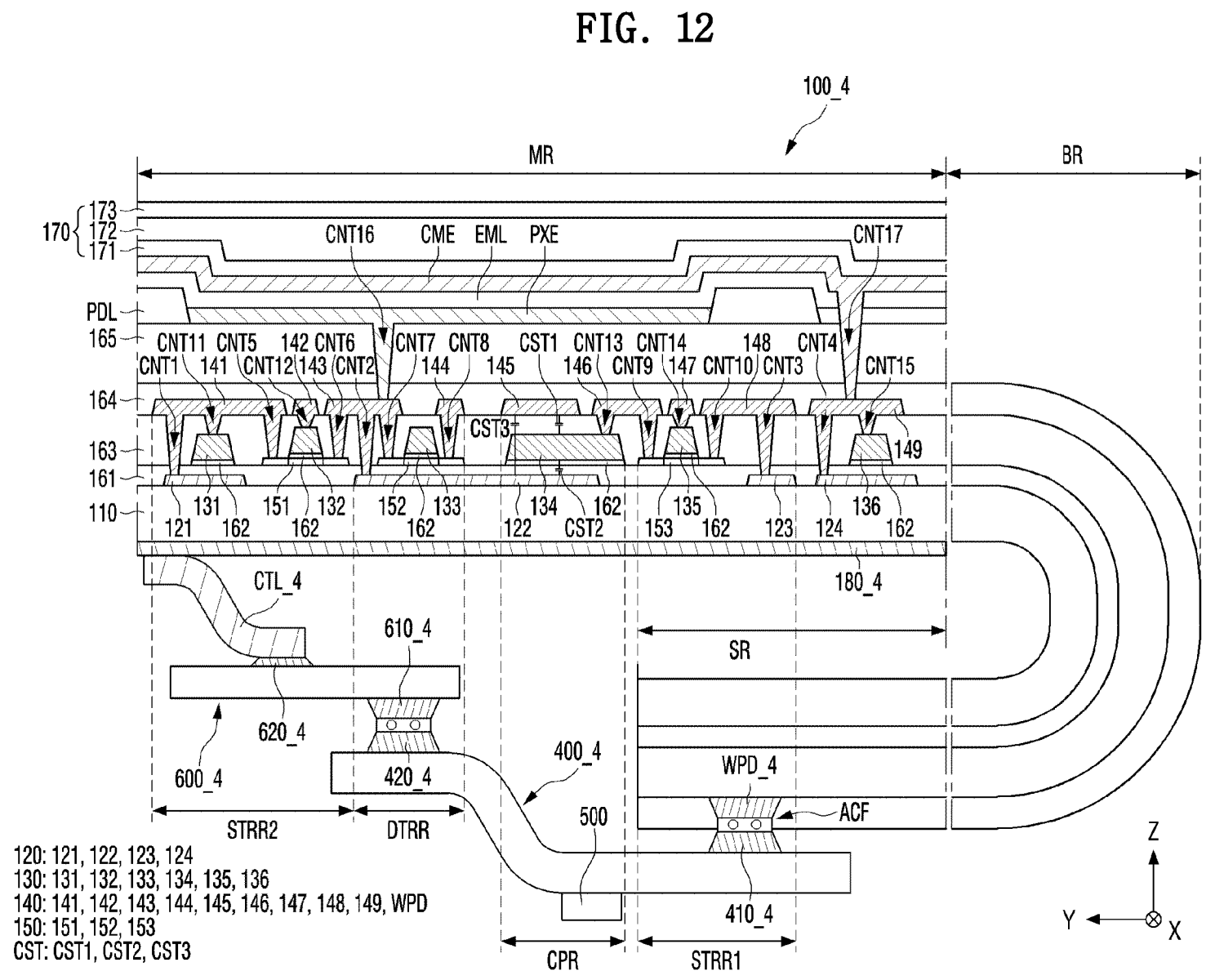

FIG. 12 is a cross-sectional view of the first display substrate of the display device of FIG. 9 according to another embodiment.

A first display substrate 100_4 according to the embodiment of FIG. 12 is different from the first display substrate 100_3 according to the embodiment of FIGS. 9 to 11 in that a first circuit board 400 is attached to a wire pad WPD_4, and that a connection conductive layers CTL_4 may be in contact with second circuit boards 600_4 and an auxiliary conductive layer 180_4.

According to this embodiment of the disclosure, one side of the first circuit board 400 may be attached to the wire pad WPD_4. For example, a first bump 410_4 of the first circuit board 400 may be attached to the wire pad WPD_4 by an anisotropic conductive film ACF. A second circuit board 600_4 may be attached to the opposite side of a first circuit board 400_4.

The connection conductive layers CTL_4 may be disposed between the second circuit boards 600_4 and the auxiliary conductive layer 180. The second circuit boards 600_4 may further include a fourth bump 620_4, and one side of the connection conductive layer CTL_4 may be attached to the fourth bump 620_4 of the second circuit board 600_4. The opposite side of the connection conductive layer CTL_4 may be in electrical contact with the lower surface of the auxiliary conductive layer 180_4. According to this embodiment, the auxiliary conductive layer 180_4 may be disposed only in the main region MR but not in the bending region BR or the subsidiary region SR. It is, however, to be understood that the disclosure is not limited thereto.

One connection conductive layer CTL_4 may be disposed for each second circuit board 600_4, but the disclosure is not limited thereto. Connection conductive layers CTL_4 may be disposed for each second circuit board 600_4 or one connection conductive layer CTL_4 may be disposed for multiple the second circuit board 600_4.

Accordingly, the wire pad WPD_4 may be electrically connected to the ninth data conductive metal layer 149 electrically connected to the common electrode CME, and the wire pad WPD_4 may be electrically connected to the connection conductive layer CTL_4 through the first circuit board 400_4 and the second circuit board 600_4. Since the connection conductive layer CTL_4 may be in electrical contact with the auxiliary conductive layer 180_4, the common electrode CME may be electrically connected to the auxiliary conductive layer 180_4.

According to this embodiment, the first display substrate 100_4 may reduce the voltage drop of the second supply voltage applied to the common electrode CME through the auxiliary conductive layer 180_4 and the connection conductive layers CTL_4 electrically connecting the auxiliary conductive layer 180_4 with the common electrode CME. For example, the second supply voltage may be applied from the second supply voltage line ELVSL to the common electrode CME through the ninth data conductive metal layer 149, and the wire pad WPD_4 may be electrically connected to the ninth data conductive metal layer 149 electrically connected to the second supply voltage line ELVSL. The connection conductive layer CTL_4 may also be in contact with the second circuit board 600_4 and the auxiliary conductive layer 180_4, to electrically connect the wire pad WPD_4 with the auxiliary conductive layer 180_4. Accordingly, the ninth data conductive metal layer 149, the wire pad WPD_4 and the connection conductive layer CTL_4 electrically connect the auxiliary conductive layer 180 with the common electrode CME, so that the voltage drop of the second supply voltage applied to the common electrode CME can be reduced.

According to this embodiment, the first display substrate 100_4 of the display device 1_3 includes the auxiliary conductive layer 180_4 that blocks electromagnetic waves and static electricity applied from the outside, prevents the semiconductor layer 150 from being exposed to light and has heat dissipation properties, and thus the reliability of the display device 1_3 including the first display substrate 100_4 can be improved.

The connection conductive layers CTL_4 of the first display substrate 100_4 according to this embodiment is disposed between the second circuit board 600_4 and the auxiliary conductive layer 180_4, to facilitate electrical connection between the common electrode CME and the auxiliary conductive layers 180_4 in a narrow space.

Figure 13:
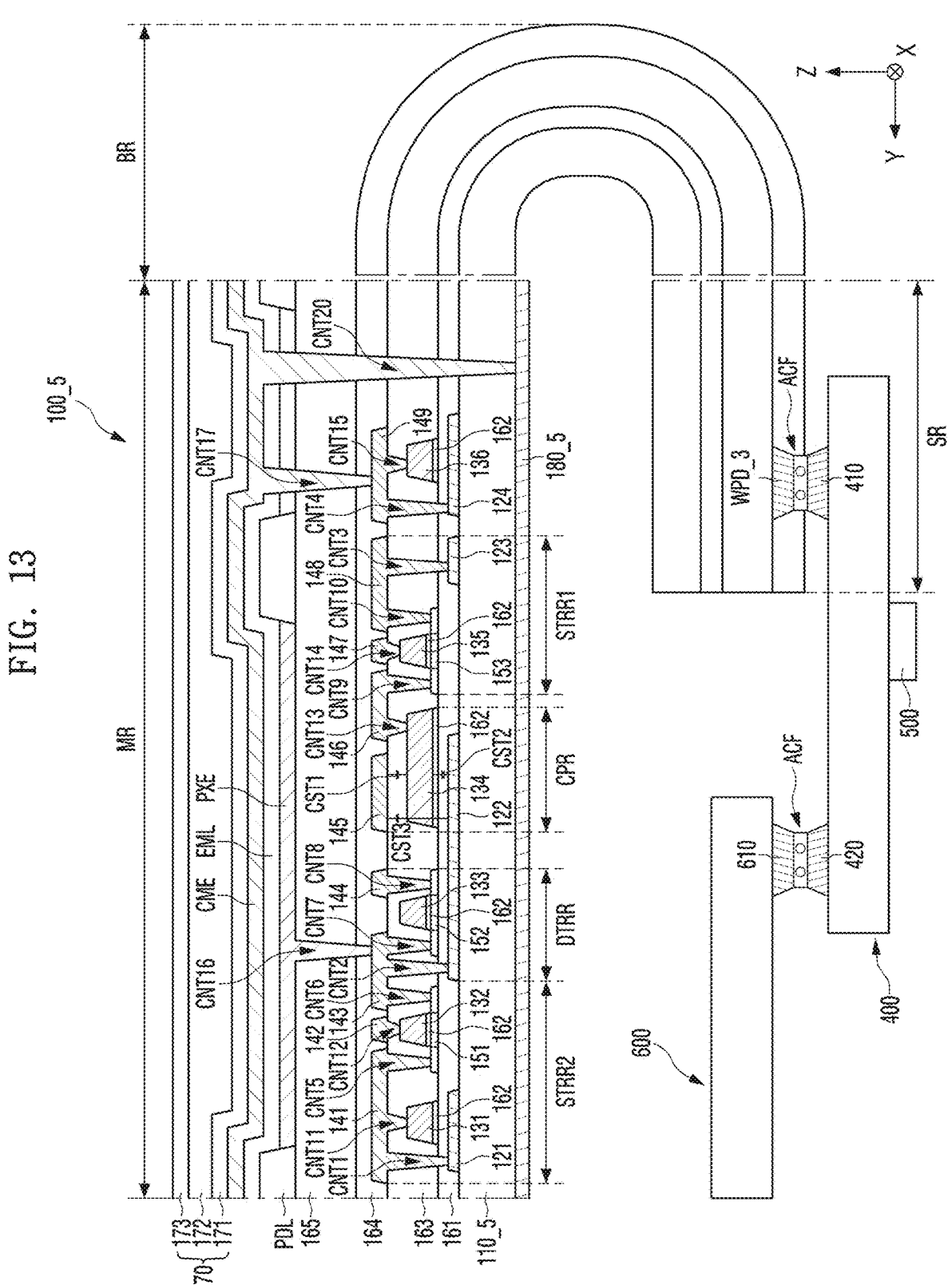
FIG. 13 is a schematic cross-sectional view of the first display substrate of the display device of FIG. 9 according to yet another embodiment.

FIG. 13 is a cross-sectional view of the first display substrate of the display device of FIG. 9 according to yet another embodiment.

A first display substrate 100_5 according to this embodiment is different from the first display substrate 100_3 according to the above embodiment of FIGS. 9 to 11 in that a common electrode CME is electrically connected to an auxiliary conductive layer 180_5 through a contact hole CNT20 penetrating through a light emitting layer EML, a via layer 165, a passivation layer 164, an interlayer dielectric layer 163, a buffer layer 161 and a first base substrate 110_5. The contact hole CNT20 may be formed in each of the pixels PX, but the disclosure is not limited thereto. The contact hole CNT20 may be formed in some of the pixels PX according to a pattern. The diameter of the contact hole CNT20 may be approximately 10 μm. The contact hole CNT20 may be formed in a location of the display area DPA other than the transistor regions DTRR, STRR1 and STRR2. The contact hole CNT20 may not penetrate any of the electrodes forming the transistors DTR, STR1 and STR2.

According to this embodiment, the auxiliary conductive layer 180_5 is disposed only in the main region MR but not in the bending region BR or the subsidiary region SR. It is, however, to be understood that the disclosure is not limited thereto.

According to this embodiment, the first display substrate 100_5 can reduce the voltage drop of the second supply voltage applied to the common electrode CME through the auxiliary conductive layer 180_5 and the contact hole CNT20 bringing the common electrode CME into contact with the auxiliary conductive layer 180_5.

According to this embodiment, the first display substrate 100_5 of the display device 1_3 includes the auxiliary conductive layer 180_5 which may block electromagnetic waves and static electricity applied from the outside, may prevent the semiconductor layer 150 from being exposed to light and may have heat dissipation properties. Thus, the reliability of the display device 1_3 including the first display substrate 100_5 may be improved.

According to this embodiment, direct contact between the common electrode CME and the auxiliary conductive layer 180_5 is implemented through the contact hole CNT20 in the first display substrate 100_5, so that it is possible to check for contact failures in the first display substrate 100_5 and cope with any such failures.

Figure 14:
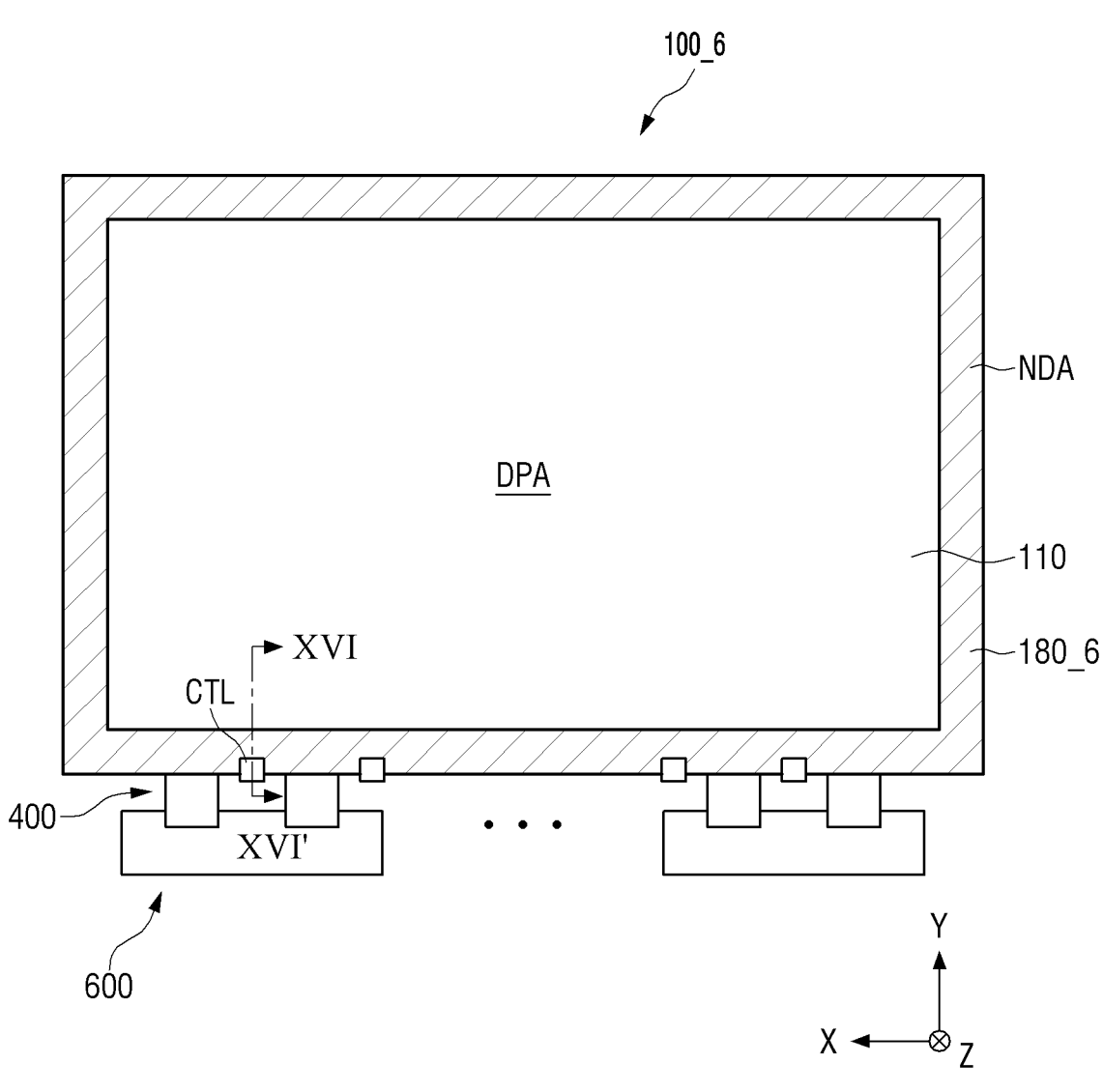
FIG. 14 is a schematic plan view showing the rear side of a display device according to yet another embodiment of the disclosure.
Figure 15:
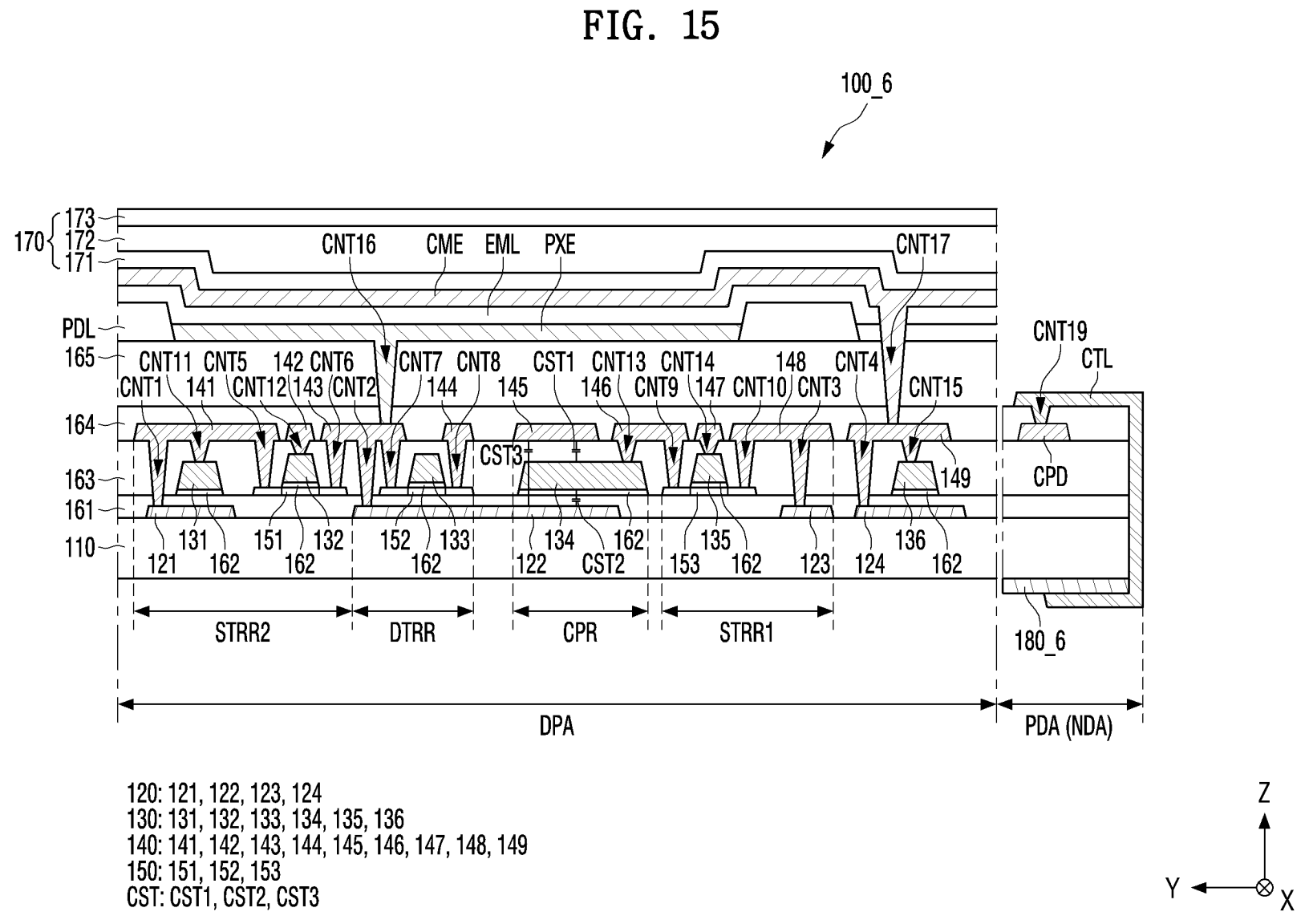

FIG. 14 is a plan view showing the rear side of a display device according to yet another embodiment of the disclosure. FIG. 15 is a cross-sectional view, taken along line XVI-XVI' of FIG. 14.

A first display substrate 100_6 according to this embodiment is different from the display device 1 according to the above embodiment in that an auxiliary conductive layer 180_6 is partially disposed on the opposite surface of the first base substrate 110. According to this embodiment, the auxiliary conductive layer 180_6 may be disposed in the non-display area NDA, but not in the display area DPA. It is, however, to be understood that the disclosure is not limited thereto. At least a part of the auxiliary conductive layer 180_6 may be disposed in the display area DPA. Although the auxiliary conductive layer 180_6 is electrically connected to the common electrode CME through the connection conductive layer CTL disposed on an end of the first display substrate 100_6 in the second directional axis Y in the example shown in FIG. 15, as described above with reference to FIG. 6, the disclosure is not limited thereto. As described above with reference to FIGS. 7 and 8, the auxiliary conductive layer 180_6 may be electrically connected to the common electrode CME by bringing the connection conductive layers CTL into electrical contact with the second circuit board 600 and the auxiliary conductive layer 180_6 or by introducing a contact hole electrically connecting the auxiliary conductive layer 180_6 with the common electrode CME.

According to this embodiment, the first display substrate 100_6 may include the rigid first base substrate 110, but the disclosure is not limited thereto. The first display substrate 100_6 may include a flexible first base substrate 110 as described above with reference to FIGS. 9 to 13.

According to the embodiment of the disclosure, the first display substrate 100_6 may include connection conductive layers CTL, so that the voltage drop of the second supply voltage applied to the common electrode CME can be reduced. For example, the second supply voltage may be applied from the second supply voltage line ELVSL to the common electrode CME through the ninth data conductive metal layer 149, and the contact pads CPD may be electrically connected to the ninth data conductive metal layer 149 electrically connected to the second supply voltage line ELVSL. The connection conductive layers CTL may be in contact with the contact pads CPD and the auxiliary conductive layer 180_6, to electrically connect the contact pad CPD with the auxiliary conductive layer 180_6. Accordingly, the ninth data conductive metal layer 149, the contact pads CPD and the connection conductive layers CTL electrically connect the auxiliary conductive layer 180_6 with the common electrode CME, so that the voltage drop of the second supply voltage applied to the common electrode CME can be reduced.

According to the embodiment, the first display substrate 100_6 may include the auxiliary conductive layer 180_6 which may block electromagnetic waves and static electricity applied from the outside, may prevent the semiconductor layer 150 from being exposed to light and may have heat dissipation properties. Thus, the reliability of the display device 1 can be improved.

According to this embodiment, the auxiliary conductive layer 180_6 is partially disposed on the opposite surface of the first base substrate 100 of the first display substrate 100_6, so that unnecessary parasitic capacitance which may occur between the auxiliary conductive layer 180_6 and other conductive layers included in the first display substrate 100_6 can be suppressed. Accordingly, the reliability of the display device 1 including the first display substrate 100_6 according to this embodiment can be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device, comprising:
   a light emitting diode that includes a pixel electrode on a first surface of a substrate, a light emitting layer on the pixel electrode, and a common electrode on the light emitting layer, the common electrode directly connected to a data conductive layer through a contact hole penetrating the light emitting layer and an insulating layer between the substrate and the pixel electrode;
   a supply voltage line on the first surface of the substrate, the supply voltage line configured to apply a voltage to the common electrode;
   a first auxiliary conductive layer on a second surface of the substrate; and
   at least one first connection conductive layer at least partially disposed on a side surface of the substrate and electrically connecting the first auxiliary conductive layer to the supply voltage line, the first auxiliary conductive layer being electrically connected to the common electrode,
   wherein the side surface of the substrate is between the first surface of the substrate and the second surface of the substrate opposite the first surface of the substrate.

2. The display device of claim 1, further comprising: first circuit boards attached to an end of the substrate; and at least one second circuit board attached to the first circuit boards.

3. The display device of claim 2, wherein
   the at least one first connection conductive layer includes a plurality of first connection conductive layers, and
   the first circuit boards and the plurality of first connection conductive layers are arranged in an alternating manner along one edge of the substrate.

4. The display device of claim 3, wherein the plurality of first connection conductive layers contact the side surface of the substrate.

5. The display device of claim 4, wherein the plurality of first connection conductive layers comprise a metal paste or a conductive tape.

6. The display device of claim 3, wherein the plurality of first connection conductive layers electrically contact the supply voltage line.

7. A display device, comprising:
   a pixel electrode on a first surface of a substrate;
   a light emitting layer on the pixel electrode;
   a common electrode on the light emitting layer;
   a supply voltage line on the first surface of the substrate, the supply voltage line configured to apply a voltage to the common electrode;
   a first auxiliary conductive layer on a second surface of the substrate;
   a first connection conductive layer at least partially disposed on a side surface of the substrate and electrically connecting the first auxiliary conductive layer to the supply voltage line;
   an insulating layer between the substrate and the pixel electrode; and a data conductive layer electrically connected to the common electrode,
   wherein the common electrode is directly connected to the data conductive layer through a contact hole penetrating the light emitting layer and the insulating layer.

8. The display device of claim 1, wherein the substrate is a flexible substrate.

9. The display device of claim 8,
   wherein the substrate comprises:
      a main region;
      a bending region extended from the main region; and
      a subsidiary region extended from the bending region and parallel to the main region, and
   the first auxiliary conductive layer is on the second surface of the substrate in the main region.

10. The display device of claim 1, wherein the first auxiliary conductive layer is entirely on the second surface of the substrate.

11. The display device of claim 1, wherein
   the substrate comprises a display area and a non-display area adjacent to the display area, and
   the first auxiliary conductive layer is on the second surface of the substrate in the non-display area.

12. A display device, comprising:
   a first insulating layer on a first surface of a substrate;
   a supply voltage line on the first insulating layer;
   a pixel electrode on the first insulating layer;
   a light emitting layer on the pixel electrode;

a common electrode on the light emitting layer, the common electrode configured to receive a voltage from the supply voltage line, and the common electrode directly connected to a data conductive layer through a first contact hole penetrating the light emitting layer and a second insulating layer; and an auxiliary conductive layer on a second surface of the substrate, wherein the supply voltage line is electrically connected to the auxiliary conductive layer through a second contact hole penetrating the first insulating layer.

13. The display device of claim 12, wherein the auxiliary conductive layer is entirely on the second surface of the substrate.

14. The display device of claim 12, wherein the substrate comprises a display area and a non-display area adjacent to the display area, and the second contact hole is in the non-display area.

15. The display device of claim 12, wherein the substrate comprises a display area and a non-display area adjacent to the display area, and the auxiliary conductive layer is on the second surface of the substrate in the non-display area.

16. The display device of claim 12, wherein the substrate is a flexible substrate.

17. The display device of claim 16, wherein the substrate comprises:

a main region;

a bending region extended from the main region; and a subsidiary region extended from the bending region and parallel to the main region, and the auxiliary conductive layer is on the second surface of the substrate in the main region.

18. The display device of claim 12, further comprising:

a first connection conductive layer at least partially on a side surface of the substrate and electrically connecting the auxiliary conductive layer to the supply voltage line.

19. The display device of claim 18, further comprising:

first circuit boards attached to an end of the substrate;

at least one second circuit boards attached to the first circuit boards; and a second connection conductive layer between the at least one second circuit boards and the auxiliary conductive layer.

20. The display device of claim 19, wherein the first circuit boards are arranged in a direction along the substrate, and the first connection conductive layer is between the first circuit boards.

21. The display device of claim 1, wherein the display device is a top-emission display device, the first auxiliary conductive layer is opaque and includes at least one of Al, Cu, Ti, or Mo.

22. The display device of claim 1, wherein the common electrode is a cathode of the light emitting diode.

23. The display device of claim 1, wherein the at least one first connection conductive layer directly contacts the side surface of the substrate.

* * * * *